(12) United States Patent
Otsuka et al.

(10) Patent No.: US 7,295,032 B2
(45) Date of Patent: Nov. 13, 2007

(54) HIGH-SPEED SIGNAL TRANSMISSION SYSTEM

(75) Inventors: Kanji Otsuka, Tokyo (JP); Tamotsu Usami, Tokyo (JP); Tetsuya Higuchi, Ibaraki-ken (JP); Eiichi Takahashi, Ibaraki-ken (JP); Yuji Kasai, Ibaraki-ken (JP); Masahiro Murakawa, Ibaraki-ken (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 502 days.

(21) Appl. No.: 10/511,720

(22) PCT Filed: Apr. 21, 2003

(86) PCT No.: PCT/JP03/05031

§ 371 (c)(1),
(2), (4) Date: Nov. 5, 2004

(87) PCT Pub. No.: WO03/090374

PCT Pub. Date: Oct. 30, 2003

(65) Prior Publication Data

US 2005/0179465 A1    Aug. 18, 2005

(30) Foreign Application Priority Data

Apr. 22, 2002 (JP) .............................. 2002-118633

(51) Int. Cl.
*H03K 17/16* (2006.01)
(52) U.S. Cl. .......................................... 326/26; 326/82
(58) Field of Classification Search .................. 326/26, 326/27, 82–86
See application file for complete search history.

(56) References Cited

U.S. PATENT DOCUMENTS 6,943,588 B1 *  9/2005  Luo et al. ..................... 326/86
7,126,378 B2 * 10/2006  Stojanovic et al. ........... 326/87

FOREIGN PATENT DOCUMENTS

JP         04-167703       6/1992

(Continued)

OTHER PUBLICATIONS

Masahiro Murakawa, Yuji Kasai, Eiichi Takahashi, Hidenori Sakanashi, Neil Marston, Kiryu Shogo and Tetsuya Higuchi, "Analog Evolvable Hardware and Its Applications," Technical Report of the Institute of Electronics, Information and Communication Engineers, vol. 100, No. 89 (May 19, 2000), pp. 1-8 (AI2000-10).

(Continued)

*Primary Examiner*—Don Le
(74) *Attorney, Agent, or Firm*—Manabu Kanesaka

(57) ABSTRACT

A purpose of a high-speed signal transmission system of the present invention is to pass a high-speed digital signal through an outside-chip line exchanging a signal with a high speed LSI chip with a band higher than GHz. The high-speed signal transmission system of the present invention has a configuration of: insertion of a circuit for feeding back received information and adjusting a waveform at a sending side based on genetic algorithm; a device structure for automatically performing pump up and pump down of a transistor carrier; a transmission line of a wiring out of a transistor; and elimination of a common power source of a circuit.

10 Claims, 43 Drawing Sheets

FOREIGN PATENT DOCUMENTS

| | | |
|---|---|---|
| JP | 04-373202 | 12/1992 |
| JP | 08-242151 A | 9/1996 |
| JP | 08-288891 | 11/1996 |
| JP | 09-326608 | 12/1997 |
| JP | 11-284126 | 10/1999 |
| JP | 2000-156627 A | 6/2000 |
| JP | 2000-174505 | 6/2000 |
| JP | 2000-196018 | 7/2000 |
| JP | 2001-210959 | 8/2001 |
| JP | 2001-211211 | 8/2001 |
| JP | 2002-124635 | 4/2002 |
| JP | 2002-300091 | 10/2002 |
| JP | 2003-224462 | 8/2003 |
| WO | WO97/50176 | 12/1997 |
| WO | JP11-511943 | 10/1999 |

OTHER PUBLICATIONS

Isamu Kajitani, Tsutomu Hoshino, Masahiro Murakawa and Tetsuya Higuchi, "Implementation of the Circuit for Determining the Neural Network Structure with GAs," Japanese Neural Network Society Journal, vol. 5, No. 4 (Dec. 5, 1998), pp. 145-153.

Kenichi Itoh, "Science and Technology," Nikkan Kogyo Shimbun, Ltd., Jul. 28, 1998, pp. 74-88.

Eikichi Yamashita, Hideyuki Ohashi and Kazuhiko Atsuki, "Simple CAD Formulas of Edge-Compensated Microstrip Lines," 1989 IEEE MTT-S International Microwave Symposium Digest (Jun. 13-15, 1989), pp. 339-342.

* cited by examiner

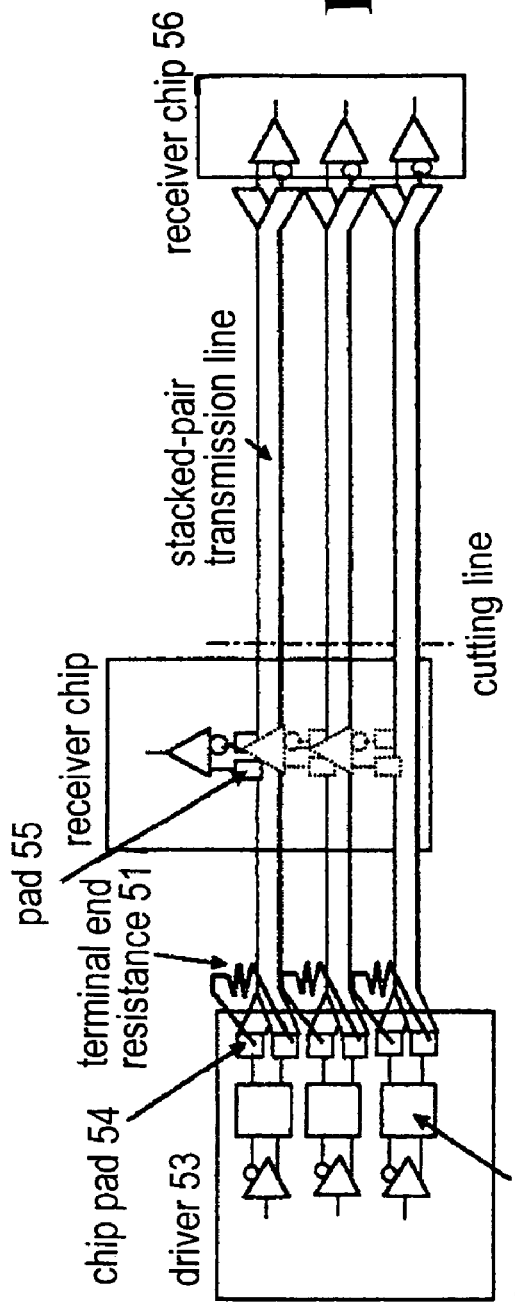
Fig. 15(a) plan view
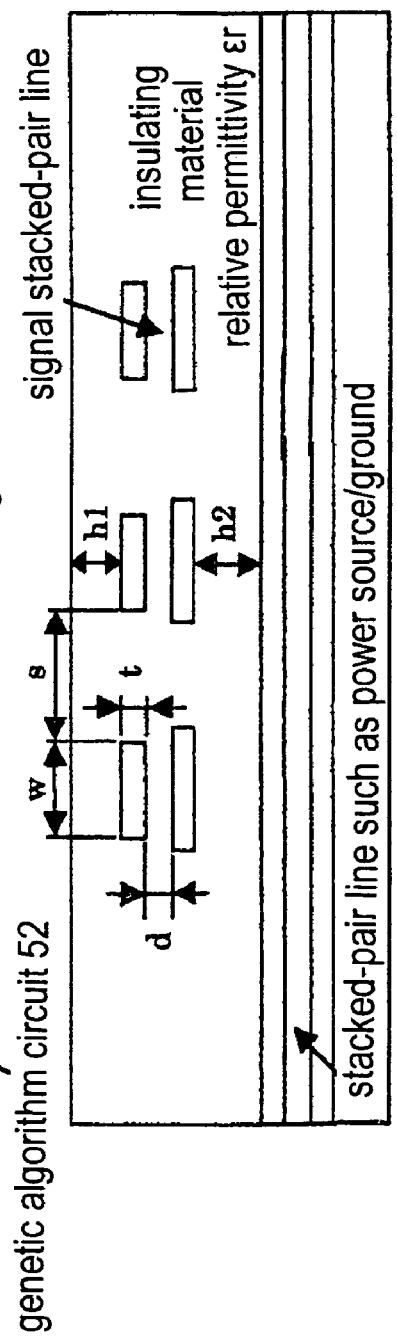
Fig. 15(b) sectional view

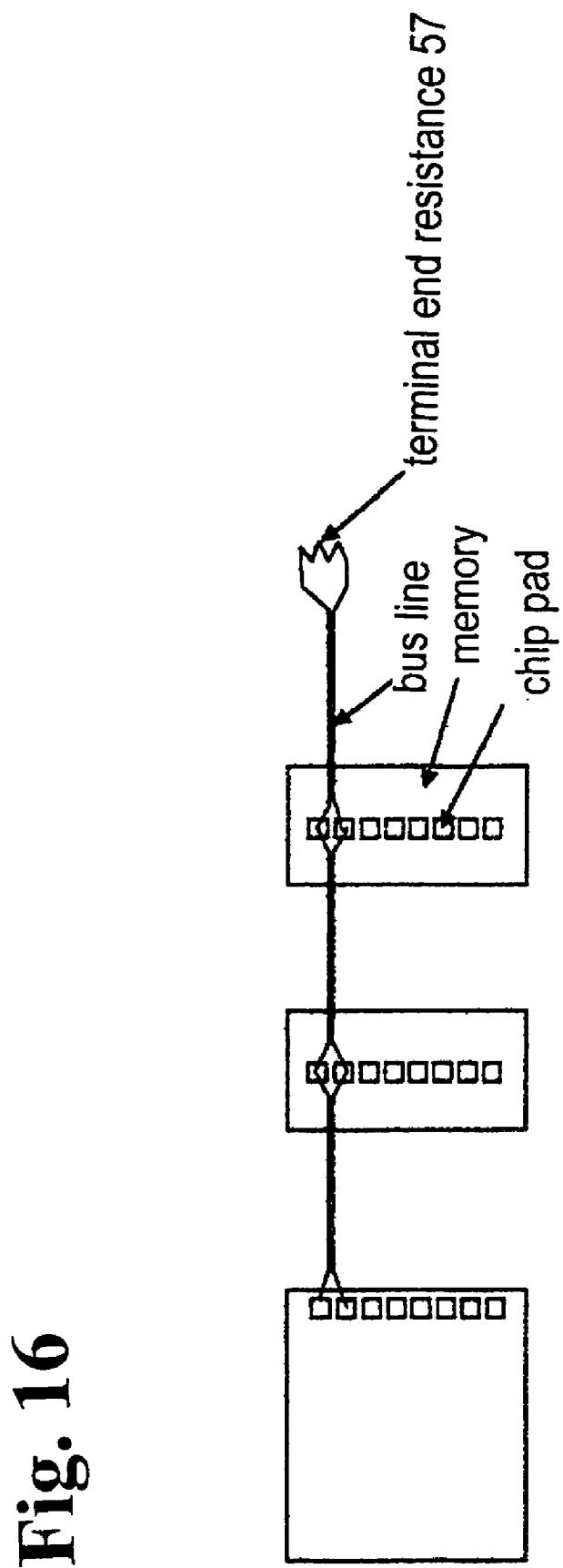

$1/Cmos = 1/Cox + 1/Ci + 1/Cb$
Cox: capacitance of insulating layer
Ci: capacitance of depletion layer under inversion layer
Cb: well capacitance

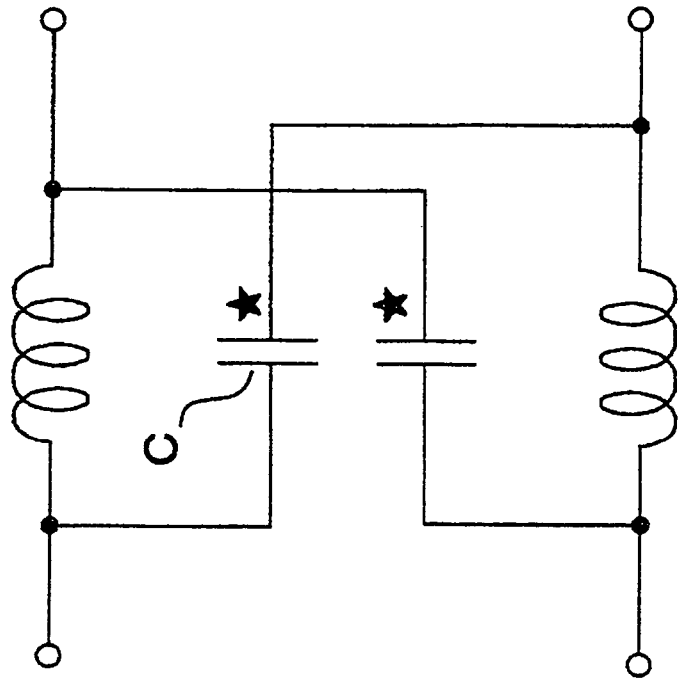
Fig. 34(b) (adjustment based on phase)
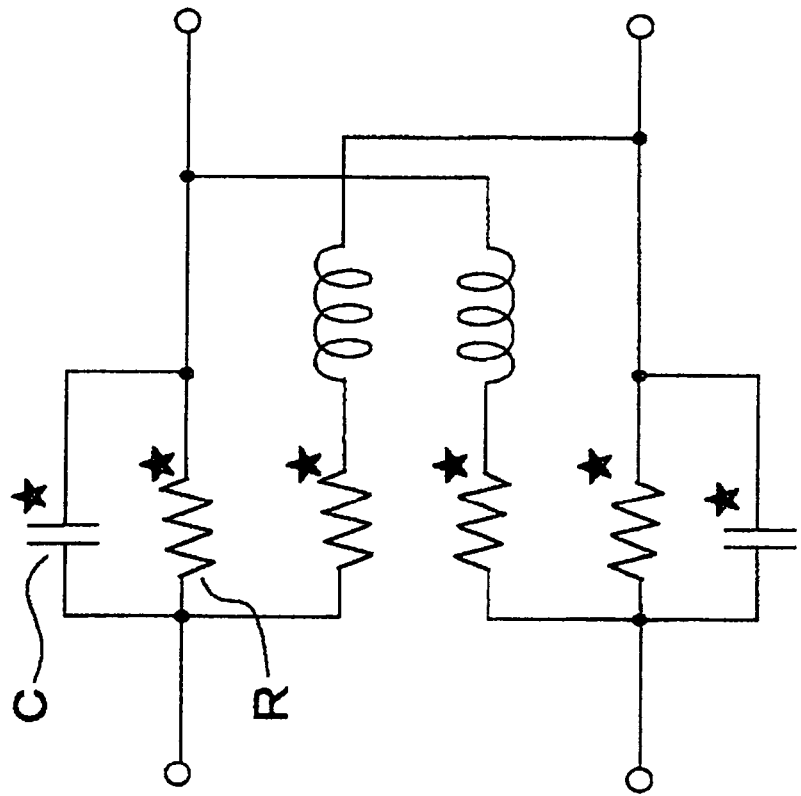
Fig. 34(a) (adjustment based on amplitude)
★: variable value C0~Cn are variable (externally adjusted) analog current values (direct current)

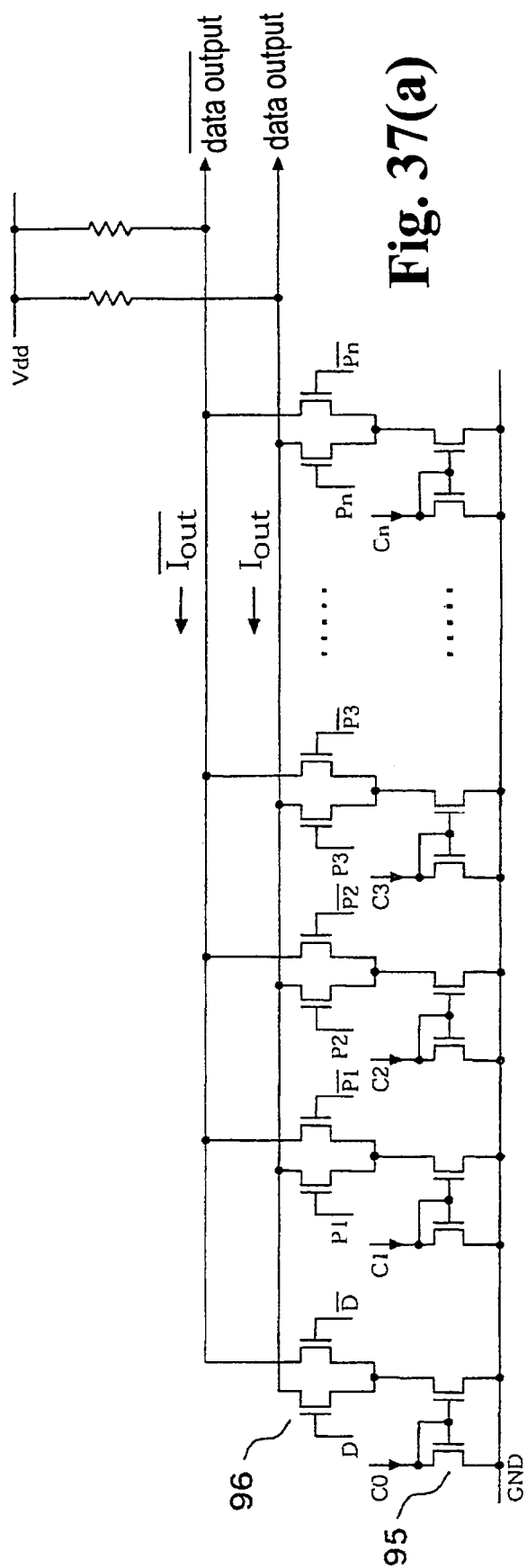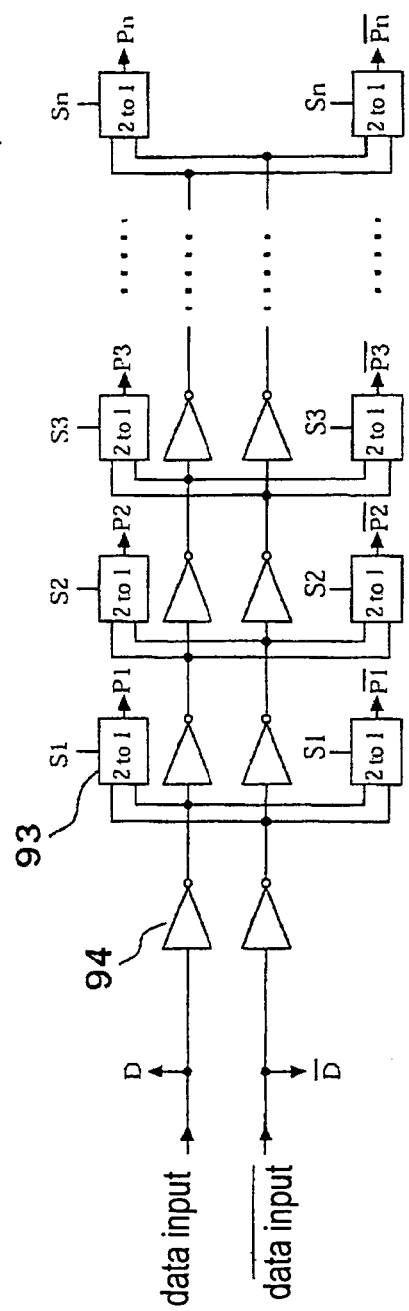
Fig. 37(a)
Fig. 37(b)
C0~Cn are variable (externally adjusted) analog current values (direct current)

Fig. 41
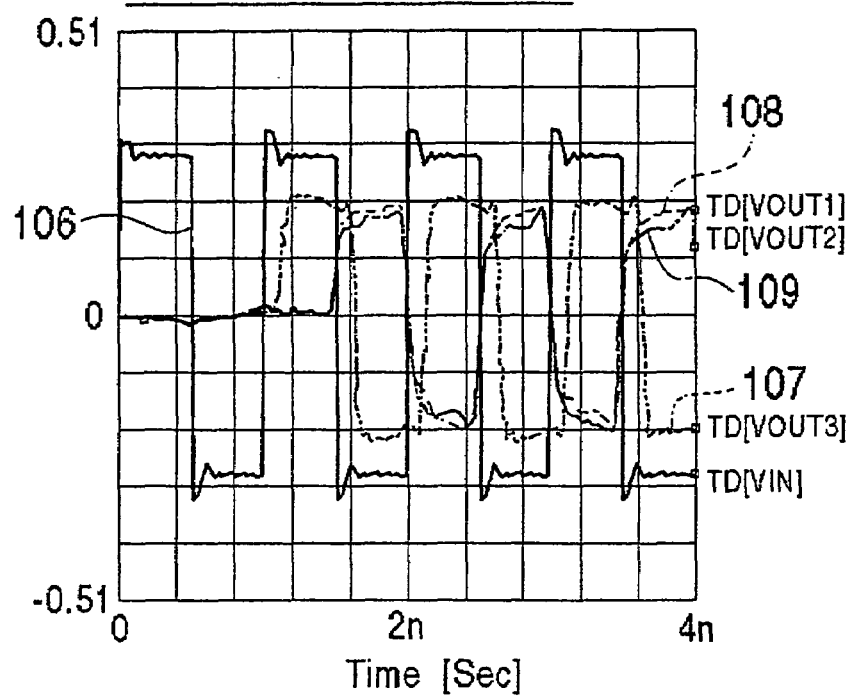
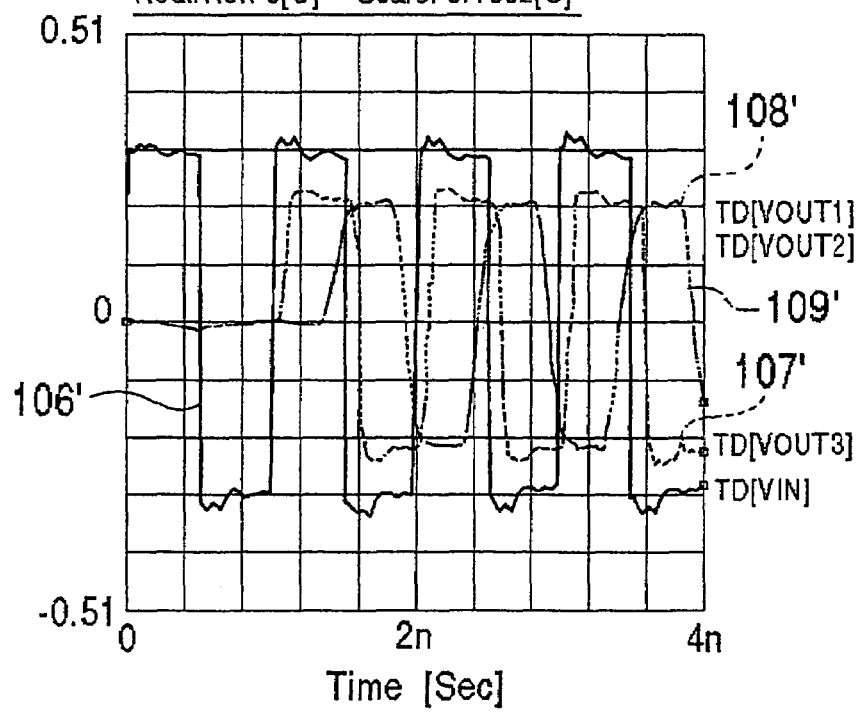

HIGH-SPEED SIGNAL TRANSMISSION SYSTEM

TECHNICAL FIELD

The invention relates to a technology for ensuring a bandwidth of an input/output circuit (hereinafter called I/O) matched to a clock of an LSI chip, that is, for making a chip clock same as a transmission clock of an I/O bus by matching a bandwidth, in an outside-chip line connected to a high-speed LSI chip for exchanging a signal with the LSI chip, thereby meeting a requirement for smooth signal processing of the high-speed LSI chip having a clock frequency of a digital signal higher than a $GH_z$ band.

BACKGROUND OF THE ART

Recently, a clock frequency of an LSI chip reaches a $GH_z$ zone. However, a frequency of an outside-chip line for exchanging a signal has been up to only 533 $MH_z$ (Rambus protocol), and a bandwidth for receiving a signal into an LSI has not been sufficient for the requirement of the LSI. In order to make the signal processing of the LSI smooth, a logic chip and memory chip are provided with a cache memory to compensate a narrow bandwidth. However, it is necessary not only to provide a large cache memory area, but also to perform an additional address calculation, thereby making architecture complex.

If it is possible to ensure an I/O bandwidth matched with the LSI clock, it is not necessary to provide the cache memory, thereby making architecture simple. In a basic digital system, a chip I/O is essentially the same as the number of processing bits in the chip. In order to match the bandwidth, the chip clock needs to be the same as a transmission clock of the I/O bus. As the chip clock enters a $GH_z$ band, it is necessary to improve the bus clock. Even though a transmission line, i.e. a basic configuration of the bus, has the specific characteristic, it is still difficult to pass a $GH_z$ band clock. In other words, in order to make the $GH_z$ transmission possible, it is necessary to make all of a driver, a receiver, and a packaging structure including the driver and receiver ready for passing a high-speed signal.

On the other hand, in a forecast of the future chip, Intel Corporation has released a MOS structure with a 20 nm gate length at the 2001 Symposium on VLSI Technology (2001. 6 Kyoto), claiming that it will be possible to process a 20 $GH_z$ digital signal (forecasted by 2007). However, in order to pass through a digital signal between 20 to 50 $GH_z$ through a wiring in a chip with a 10 mm square, it is necessary to design a new configuration quite different from a concept of an RC charge and discharge circuit. In other words, in order to provide a unified environment over an entire system, it is necessary to design a totally new system.

DISCLOSURE OF THE INVENTION

An object of the present invention is to provide a transmission system connected to a high-speed LSI chip with a clock frequency in a band higher than $GH_z$ for passing (transmitting) a high-speed digital signal with a band in tens of $GH_z$ through an outside-chip line exchanging a signal with the LSI chip, while using a conventional system and parts as much as possible.

In order to solve the problem mentioned above, the present invention employs: a device structure for automatically performing pump up and pump down of a transistor carrier; insertion of a circuit (hereinafter called a genetic-algorithm circuit and so on) for feeding back received information and adjusting through a statistical search method such as the genetic algorithm for adjusting a waveform at a sending side; conversion of a wiring extending out of a transistor into a transmission line; and elimination of a common power source of a circuit. In other words, in transmission of a pulse signal with a $GH_z$ band, it is necessary to eliminate restriction in a process of applying pulse energy to a circuit or line (process of changing a charge Q) as much as possible, and eliminate a discontinuous spot causing reflection.

More specifically, the high-speed signal transmission system of the present invention includes an outside-chip line without a branching wiring connected to a high speed LSI chip with a clock frequency in a $GH_z$ band, and formed of a logic circuit and memory circuit of a transistor throughout an entire electronic circuit such as a sending end and a terminal end as differential inputting and outputting, for exchanging a signal with the above-mentioned LSI chip. One of the sending end and the terminal end of the outside-chip line is connected to a power source or ground in order to recognize a reference potential. The other of the sending end and the terminal end opposite to the one end for recognizing the reference potential is not connected to the power source or ground. Further, a power-supply line in the system is formed of pair lines of the power source and ground. Each element circuit of a minimum logic element circuit and a memory element circuit is connected with one exclusive pair line.

Further, the high-speed signal transmission system of the present invention includes an outside-chip line without a branching wiring connected to a high speed LSI chip with a clock frequency in a $GH_z$ band, and formed of a logic circuit and memory circuit of a transistor throughout an entire electronic circuit such as a sending end and a terminal end as differential inputting and outputting, for exchanging a signal with the above-mentioned LSI chip. A MOS differential sense amp is connected to the terminal end. A regulator circuit is added to an output circuit and a waveform analysis circuit analyzes signal transmission of the line to detect a defect and reshape a sending waveform, so that a received waveform is properly sent to the sense amp. The regulator circuit is adjusted through statistical search method. In addition, the sense amp is formed of a MOS-FET having a gate capacitance less than 10 fF. The statistical search method includes one or a combination of genetic algorithm, climbing-up method, annealing method, enumeration method, evolution policy, and taboo search method.

Also, the transmission line differentially output via the circuit adjusted by the statistical search method is matched with characteristic impedance throughout the sending end and the terminal end. The sense amp receives a mixture of the sending waveform and a total-reflection waveform, and has a terminal resistance at the sending end, so that the total-reflection waveform is not transmitted from the sending end through re-reflection.

Also, the connecting line (signal transmission line, power source and ground pair lines) described above has a structure maintaining a TEM mode. When the connecting line has a portion wherein an electromagnetic wave leaks into air, the portion is coated with a high permittivity material, so that an effective permittivity of the portion matches with a permittivity of an internal dielectric member. Moreover, the transmission line is composed of one of a pair coplanar, stacked-pair, guard stacked-pair, and guard coplanar.

Also, when the circuit is composed of a plurality of bits, the circuit has a relatively same physical structure throughout the whole line with an isometric wiring length based on a parallel isometric wiring. A circular wiring is used to make a fan-out wiring isometric.

In addition, active elements of a driver circuit and a receiver circuit include a MOS-FET of Si or SiGe (field-effect transistor), or a n-channel MES-FET of GaAs; and are composed of a differential output circuit and differential input circuit without a ground connection; a short-key high-speed bipolar differential circuit; or a bus-switch circuit. A varactor formed of a complementally same MOS-FET, MES-FET, and a bipolar transistor structure is arranged in all the transistors. Moreover, a common well in the above-mentioned case is electrically floated.

BRIEF DESCRIPTION OF THE DRAWINGS

FIG. 15 is a diagram showing a structure of a transmission line connecting between chips;

FIG. 16 is a diagram showing a restriction of a chip pad arrangement;

FIG. 34 is a diagram showing a circuit for adjusting a waveform on a frequency axis shown in FIG. 33;

FIG. 37 is a diagram showing a mounted example of a circuit for adjusting a waveform on the time axis shown in FIGS. 35;

FIG. 41 is a chart showing waveforms of the circuit shown in FIG. 40;

DESCRIPTION OF REFERENCE NUMERALS

1 Driver; 2 Receiver; 3 Sending end; 4 Receiver end; 5 and 6 Receiving-end matching resistance; 7, 8, and 9 Transistor-on resistance; 10 Transmission line; 21 and 22 Transistor; 51 Terminal-end resistance; 52 Genetic-algorithm circuit; 53 Driver; 55 Receiver chip; 91 Waveform analysis circuit; 92 External device; 93 Switching circuit; 94 Delay circuit; 95 Variable current source; and 96 High-speed switch.

DETAILED DESCRIPTION OF PREFERRED EMBODIMENTS

Details of the present invention will be explained with reference to the accompanying drawings.

I/O Driver and Receiver Circuit Structures of LSI Chip

Figure 2:
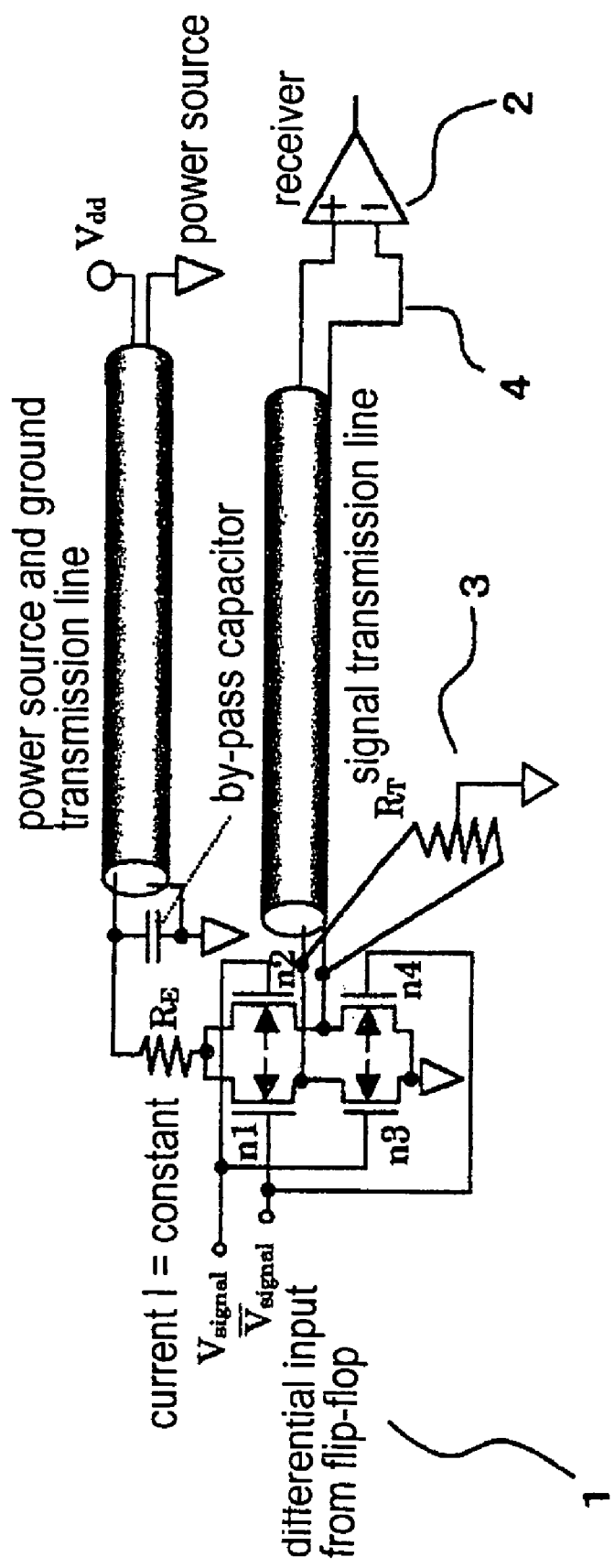
FIG. 2 is a view showing an example of a structure connecting a driver and a receiver of the present invention.
Figure 10:
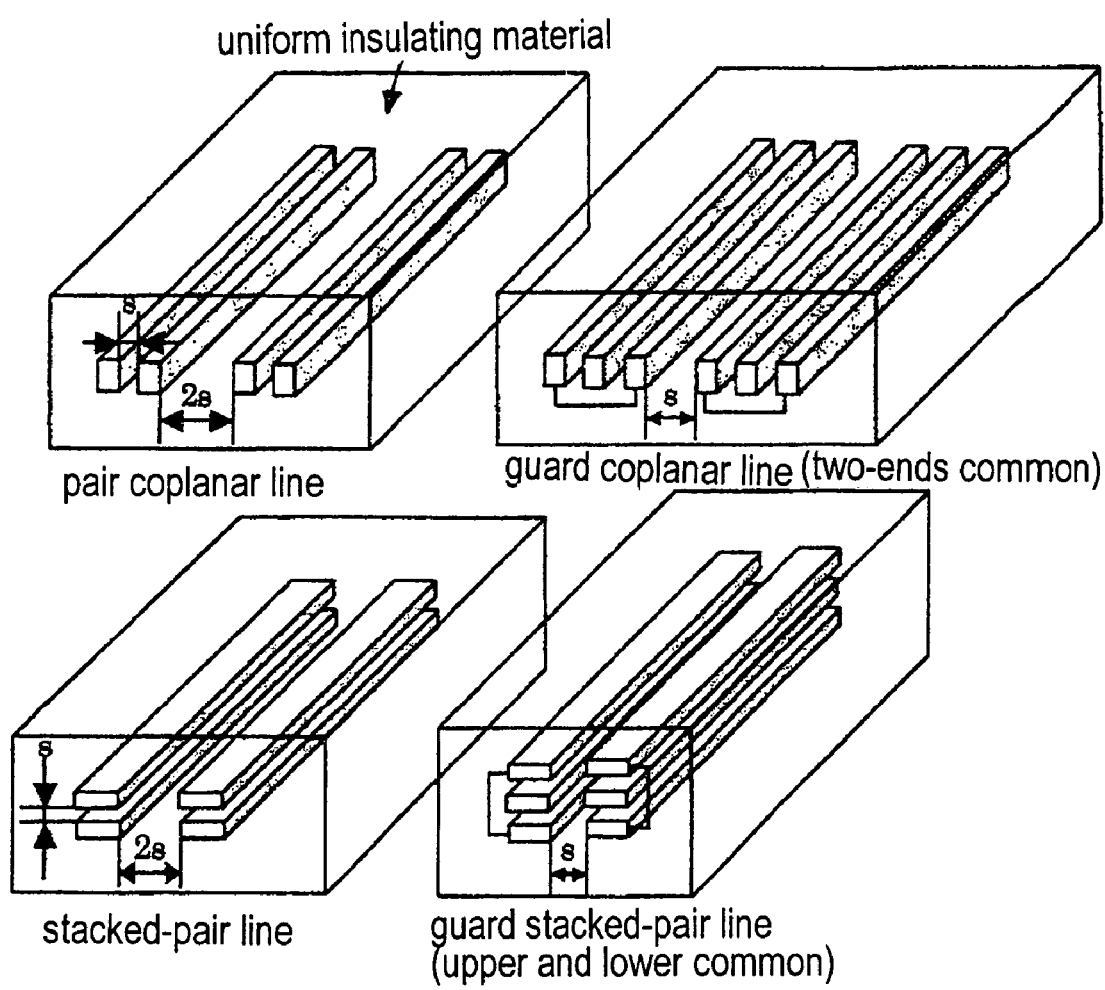
FIG. 10 is a view showing a transmission line suitable for a transmission system of the present invention.

First, FIG. 2 shows a circuit for exchanging a signal of the present invention. Structures of the driver 1 and receiver 2 making the differential output possible are described here. A sending end has a ground connection 3, and a receiver end 4 has no ground connection, which is substantially different from a conventional system. In addition, in FIG. 2, the signal transmission lines are shown as coaxial lines for easy explanation. Actual signal transmission lines are formed of pair lines (two parallel lines) as shown in FIG. 10. Hereinafter, same applies to FIGS. 5, 6, 14, 21, 24, 25, and 26.

First, an electromagnetic concept will be explained for the background knowledge of a phenomenon when the signal transmission lines are operated at a high speed.

In general, a pulse as a signal is a synthetic wave including higher harmonic waves of a plurality of sinusoidal waves. When a clock frequency of the pulse is a basic wave (approximately 82% of energy), the synthesis wave includes: a third-harmonic wave with approximately 9% of energy; a fourth-harmonic wave with approximately 3% of energy; a fifth-harmonic wave with 2% of energy; a seventh-harmonic wave with 1% of energy; and a higher odd number order harmonic wave with small energy. In view of a safety, a higher harmonic wave with an energetic problem should include a frequency with one digit higher relative to the clock frequency of the pulse. In other words, for example, if there is no 20 GHz transmission band for a 2 GHz pulse, a distortion of the waveform occurs in the pulse. Also, even with the same pulse frequency, when there is an abrupt rise time tr (fall time tf), a high frequency has high energy. Based on the rise time, a frequency f in a band necessary for transmission is f=0.35/tr or f=0.35/tf. This is called a pulse effective frequency. Accordingly, the transmission band includes the pulse effective frequency.

It is well known that a sinusoidal-wave energy-transmitted at an electromagnetic-wave speed resonates with a transmitting distance, i.e. a turning point of the wave. The minimum turning point is a quarter wavelength ($\lambda/4$). When the above-mentioned high-order harmonic wave resonates, a transmission conductance of the sinusoidal wave becomes $\infty$ (infinite), in other words, the resistance becomes 0, so that the sinusoidal wave is transmitted with a big difference from a finite conductance of the other sinusoidal wave. More specifically, the sinusoidal wave is amplified. In an extreme case, a higher harmonic wave with a few % of energy is transmitted with the same energy as the basic wave, and the pulse waveform is significantly distorted. At the same time, electromagnetic radiation can be generated.

The above-mentioned CPU of Intel Corporation handles up to the ninth-harmonic wave with a 20 $GH_Z$ clock frequency. This corresponds to a 180 $GH_Z$ sinusoidal wave. Since a speed of the electromagnetic wave of the line transmitting in a material with a relative permittivity $\epsilon r=4$ is $1.5 \times 10^8$ m/s, a quarter wavelength $\lambda/4$ of 180 $GH_Z$ is 210 µm. Therefore, in order to avoid the above-mentioned resonance, it is difficult to arrange a wiring with a length greater than 210 µm inside an LSI chip. If necessary, a repeater circuit has to be inserted. Realistically, a length of the wiring needs to be smaller than this length in view of delay due to RC charge and discharge. A whole global wiring inside an LSI chip has to be a transmission line capable of handling a high frequency wave in order to pass a high-order harmonic wave component through.

Figure 1:
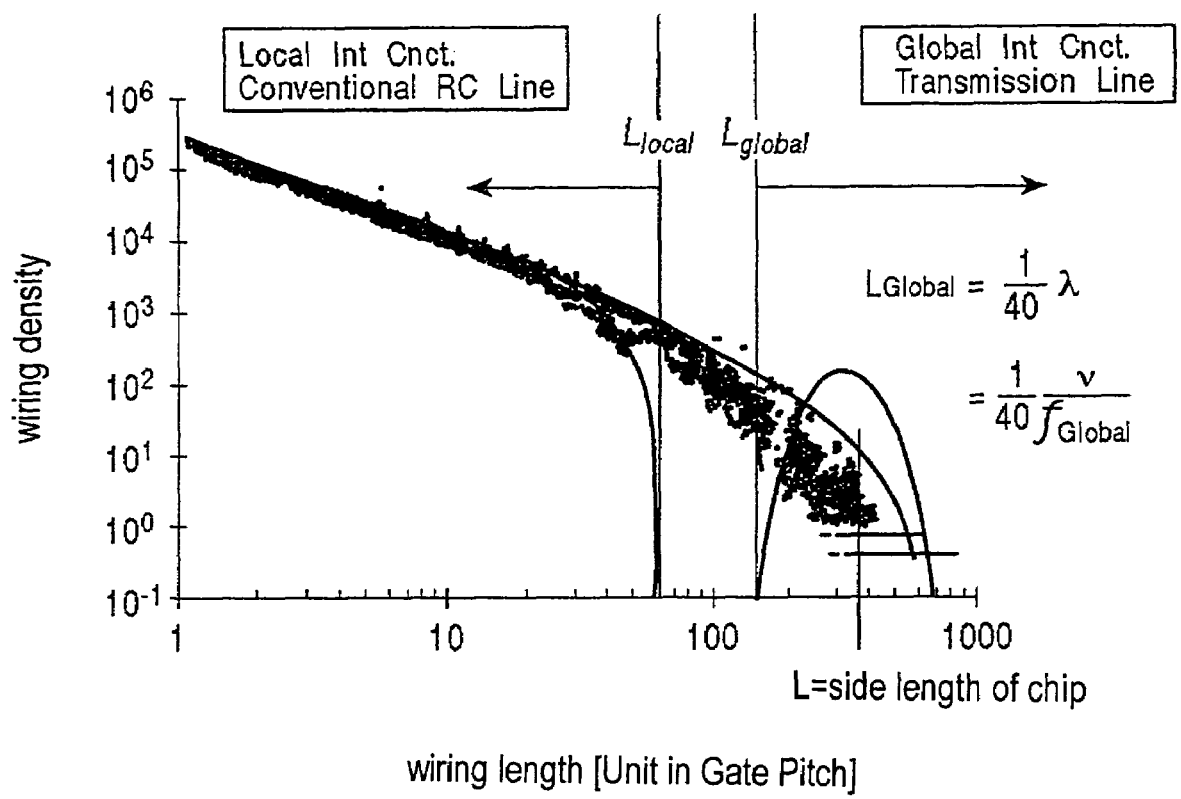
FIG. 1 is a graph showing a distribution of a general wiring length in an LSI design.

In the general LSI design, a length distribution of the wiring is shown in FIG. 1. A long wiring is called the global wiring between functional blocks of an LSI. Kazuya Masu at Tokyo Institute of Technology has proposed to separate a portion necessary to be a transmission line (lumped parameter circuit portion) shown in FIG. 1 from a portion necessary to be the transmission line (distributed constant circuit).

The present invention becomes practical to follow the proposal. Assuming that 10% of a circuit structure inside an LSI requires a long wiring, a countermeasure for the problem of the high frequency wave of the present invention will be explained.

In order to obtain an output signal of the driver with a pulse wave, it is necessary to provide a switch and a power source. However, when a large amount of an electric current flows at once from a state wherein there is no electric current flowing, an electric-current transition gradient di/dt becomes steep, and a voltage of v=Ls (di/dt) (Ls; parasitic inductance) is generated, so that the power source Vdd goes down by the voltage v at once (Vdd−v). When the clock frequency increases by one order, v increases by one order in the same wiring structure. The parasitic inductance Ls in the circuit is estimated to be 10 pH in the wiring length of 10 µm. Conventionally, when the circuit with 10 pH is acceptable, in order to increase the frequency by one order, the wiring length has to be 1 µm, i.e. 1 pH. Or in order to maintain the 10 µm wiring, Ls has to be 0.1 pH, or the electric current has to be constant. It is difficult to achieve these conditions in the lumped parameter circuit design. However, it is possible in the distributed constant circuit. Now, a specific circuit will be explained.

Figure 24:
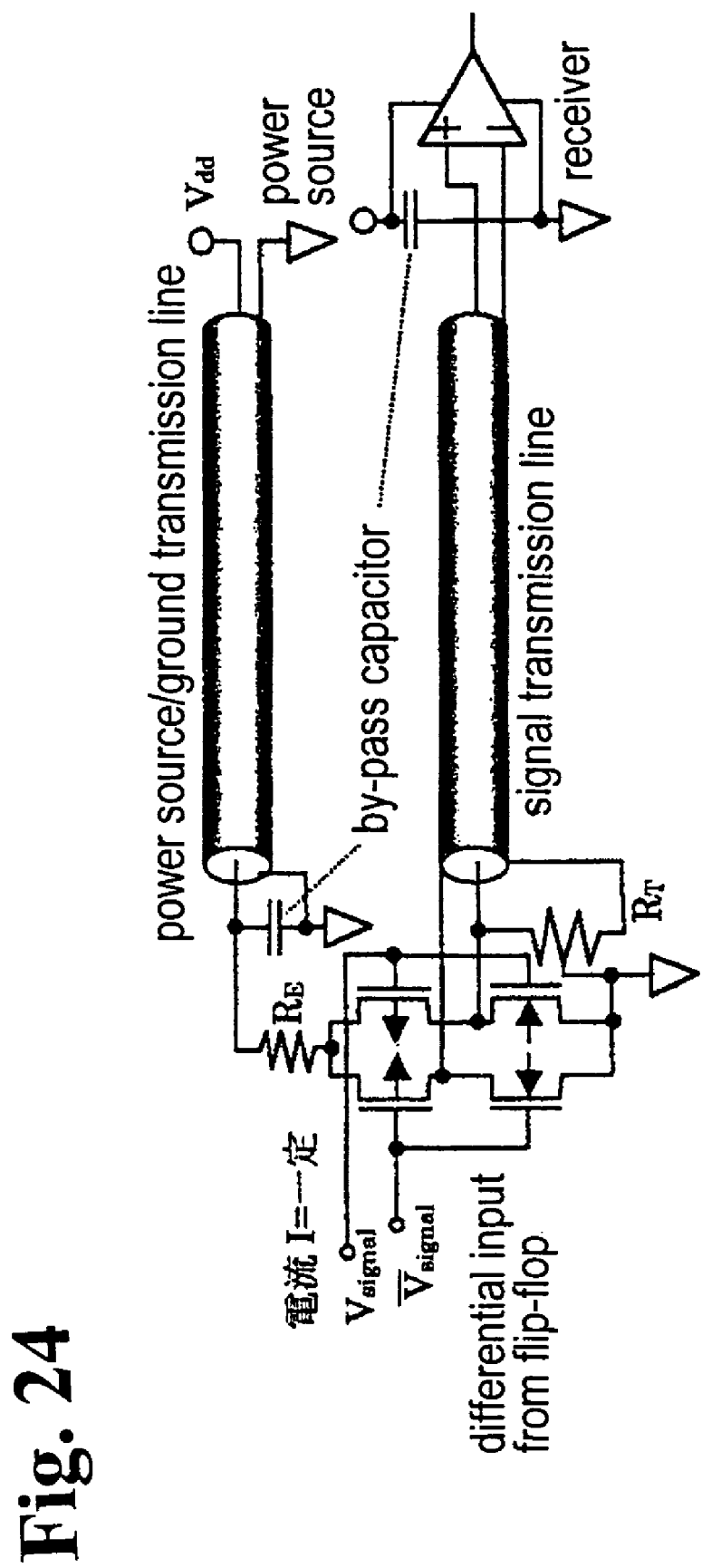
FIG. 24 is a diagram showing another example of a structure connecting the driver and the receiver of the present invention (not including a genetic-algorithm circuit)

When a signal rise tr in the $GH_Z$ band is less than 10 ps, the pulse effective frequency becomes greater than 35 $GH_Z$, so that it is difficult to operate the conventional circuit. Although a current-switch type driver including a well-known ECL circuit is used for solving the problem, it is still very difficult. A differential circuit shown in FIG. 2 is formed of one step n-MOS in place of the ECL, and can solve the problem. Another embodiment composed of the CMOS is shown in FIG. 24. In FIG. 24, a bypass capacitor at the receiver end is also separated from a gate of the receiver, so that the bypass capacitor does not come down to ground.

Usually, a front step of the driver has a latch and is a flip-flop circuit. The circuit inevitably has a differential output end, so that the input signal to the driver is the n-MOS arranged complimentarily, and a differential switch can be made easily. In the circuit including many transistors, the more the transistor increases, the more a p-n connecting capacitance increases, so that a large overlapped momentary current flows. Also, when the signal is switched over, the overlapped momentary current has to be discharged, so that the switching operation is delayed.

In order to prevent the above-problem, the driver circuit has to be composed of the minimum number of transistors as shown in FIG. 2. A resistance $R_E$ (3) connected in series with the transistor is preferably a metal-coat resistance formed of tungsten, molybdenum, or silicide, not a diffusion resistance which causes the p-n connecting capacitance.

Although the receiver in FIG. 2 is represented as the logic-circuit diagram, the receiver may be the same circuit as the driver circuit, and a receiving differential signal is received at a gate of the differential receiver, and not connected to ground. Details thereof will be explained.

Figure 3:
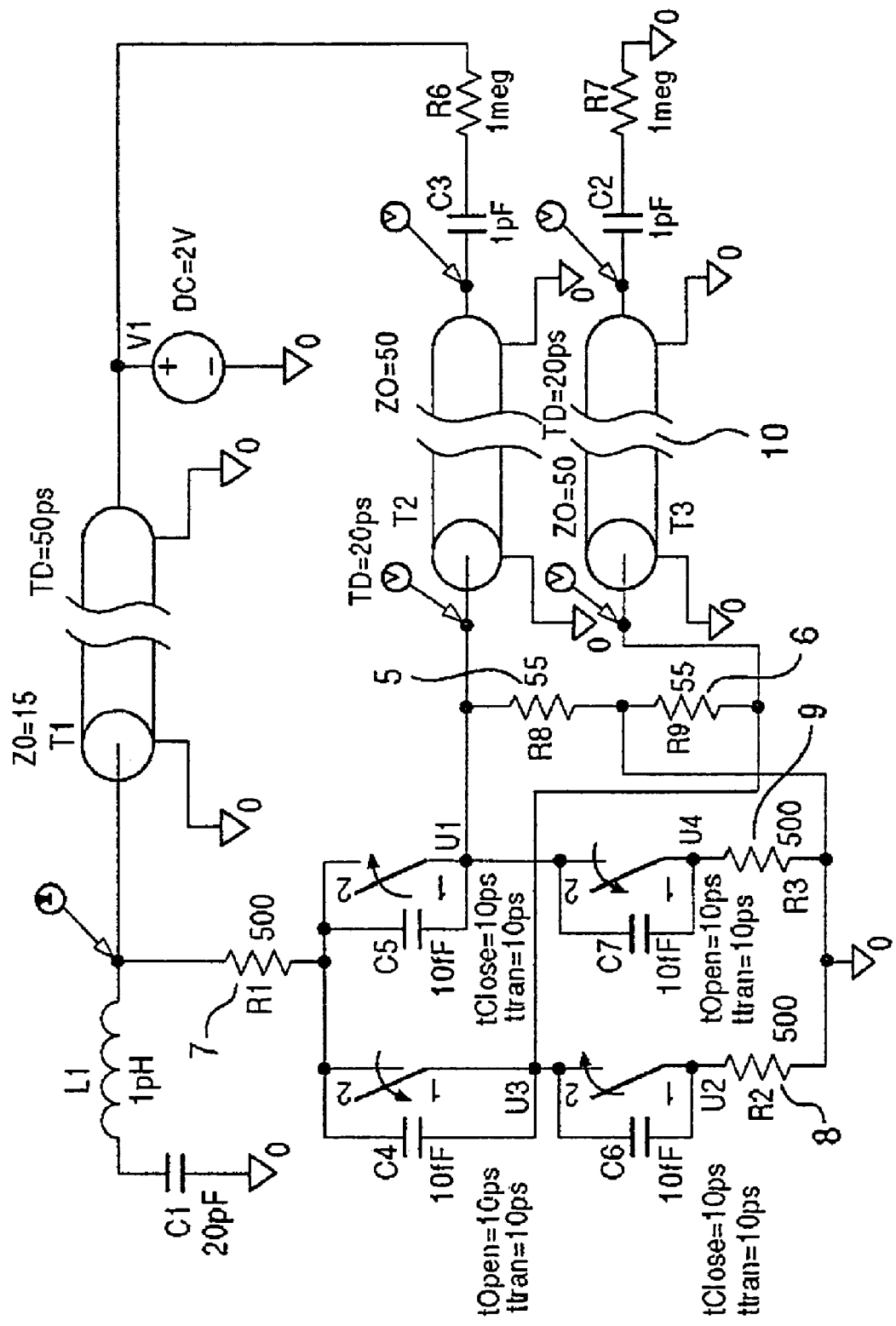
FIG. 3 is a diagram showing a simulation model circuit with a 35 $GH_Z$ pulse effective frequency of the present invention.
Figure 4:
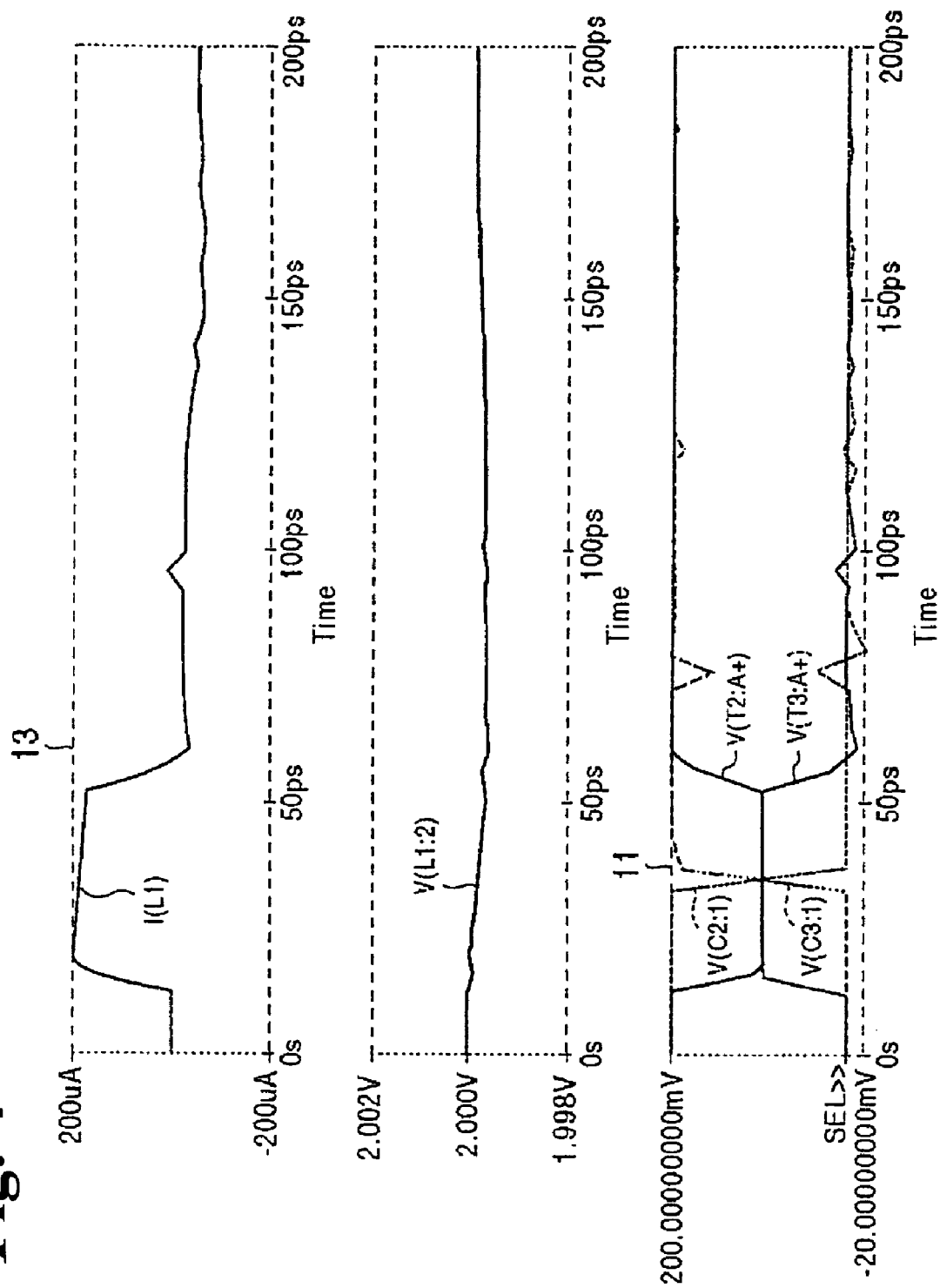
FIG. 4 is a graph showing a simulation result of FIG. 3.

An effect of the circuit will be verified with simulation. FIG. 3 is the driver circuit of the present invention with tr=tf=10 ps (35 $GH_Z$ pulse effective frequency). The power supply voltage is set in Vdd=2 V, and the transmission line voltage is 0.05 V (receiving end is 0.1 V due to total reflection). The simulation result is shown in FIG. 4. The numbers R8 and R9 (5, 6) represent the receiving-end alignment resistance 55 Ω, and the numbers R1, R2 and R3 (7, 8, 9) represent the transistor-on resistance 500 Ω. The numbers U1, U3, and U2, U4 show the switching operation of the differential transistor. The on-resistance of the simulation circuit is 0.001 Ω, and the off-resistance of the simulation circuit is 1 MΩ. In order to set up the transistor-parasitic capacitance, C4, C5, C6 and C7 of 10 fF are added. The transmission line 10 has the characteristic impedance 50 Ω controllable in the LSI, and the delay of 20 ps equivalent to a line length of 3 mm in the line surrounded by an insulator with the relative permittivity εr=4 is set. In case of being inputted into the differential gate, a gate capacitance of 5 fF is added, respectively. The characteristic impedances of the power source line and ground pair line thicker than the signal line are set to be 15 Ω, and are provided from a long distance of 7.5 mm. A bypass capacitor of 20 pF is scattered inside the chip. Here, symbol Li represents the parasitic inductance of the bypass capacitor and the capacitance thereof is small, so that the opposing current pass is short and the bypass capacitor is set to be 1 pH. The differential signal is treated as a single end as shown in FIG. 2; however, since there is no such a tool in the simulation, two pairs of the transmission lines and the power source and ground are represented.

Although the signal-voltage amplitude of the receiving end is very low, 0.1 V (11), an electric potential difference has amplitude sufficient for detecting in the differential input and output. A constant current passes through between charge and discharge of the transmission line, and the constant current is made small for low-power to be 200 μA (13). The consumption is 2V×200 μA=400 μW per 1 driver and per 1 transition. It is relatively large power consumption, and as a guideline, it is necessary to be a global wiring of the design to limit the consumption in approximately 10% per LSI.

Even with such a high frequency, the constant current is nearly maintained in the simulation, so that there is almost no problem. A current indent (spike-like change) should come out as the gate volume 10 fF of the transistor. The reason for completely invisible current indent is that they exist complementarily. This is the explanation of FIG. 4 as described later. A change in the switching time constant τ by voltage dependence of drains and sources of two series n-MOS can be ignored since there is almost no difference in the voltages.

When a transition to the next output signal comes in a time period between the charge and discharge in the transmission line (2 tpd), the waveform is distorted, so that 2 tpd becomes 40 ps in the wiring length of 3 mm, and frequencies with higher periods become a problem. That is, since 40 ps corresponds to a frequency of 25 $GH_z$, the circuit is operative with the pulse frequency of 25 $GH_z$. For example, when the wiring is held in 1.5 mm, the frequency becomes 50 $GH_z$.

Proposals of the present invention around the driver are as follows.

(1) The differential driver is composed of the transistor with one step or a parallel circuit of the transistor with one step.
(2) The regulator circuit connecting to the parallel circuit of the differential driver or the differential driver is optimized by the genetic algorithm (described later).
(3) The power source and ground are pair transmission lines.
(4) In order to flow the complementary current of ground for the power source (in general, it is called a return current; however, since the return current is likely to cause misunderstanding, it is referred to as the complementary current), the bypass capacitor is provided at the end of the driver.
(5) The differential signal is operated at the single end transmission line structure (FIG. 2), and does not have a differential based on general ground.
(6) The matching terminal end is the same value as the characteristic impedance of the single end transmission line, and the midpoint thereof is the basis ground and also the current pass.
(7) The waveform analysis circuit is placed on the receiving side, and the waveform regulator circuit is placed between the terminal end resistance and the driver.
(8) The differential driver is provided in the same well structure, and complementary utilization by inversion signals of internal accumulation charges is considered at each channel (in a case of the MOS-FET) and base (in a case of the bipolar transistor: in this case, a common collector structure).

In (8), the accumulation charges of C4, C5, C6 and C7 in FIG. 3 are reutilized during the reversion, and an indent peak of the simulation result in FIG. 4 can be obtained. In the same well structure, the characteristic of the transistor with the same size is less likely to be unbalanced, and the completely same amount of the charge can be pumped up and pumped down.

Figure 5:
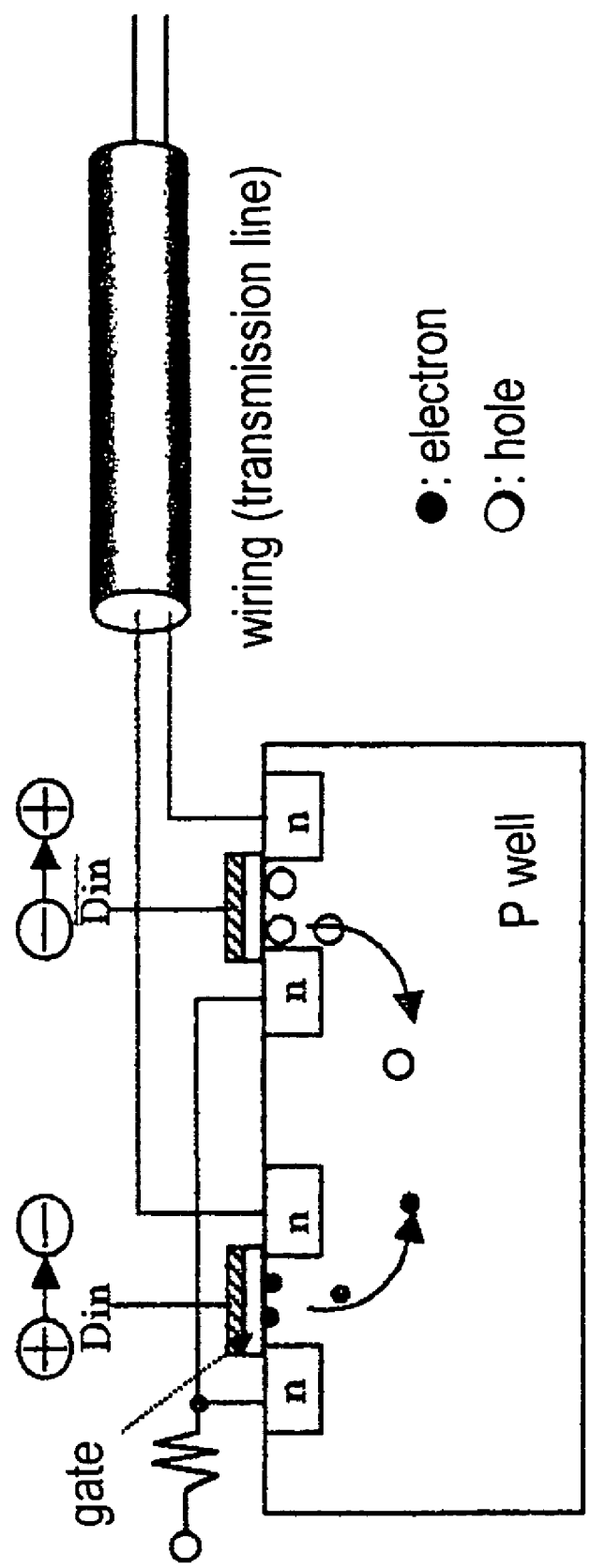
FIG. 5 is a cross-sectional view showing an example of the driver with an n-MOS structure of the present invention shown in FIG. 2.

FIG. 5 represents an example of a cross-sectional structure of the transistor to attain the function in (8).

The differential driver transistor is placed in the same well structure. When a channel charge attracted to each gate electrical potential (although electrons are a few induced-conduction carriers in the n-MOS, and holes are many carriers inside the well and not the channels, the high density of the holes is referred to as the channel temporarily) is freed at a complementary input signal, an adjacent transistor starts to pull, so that a high-speed carrier exchange can be obtained. Also, the electrical charge is reutilized, thereby saving a great amount of electricity.

Figure 6:
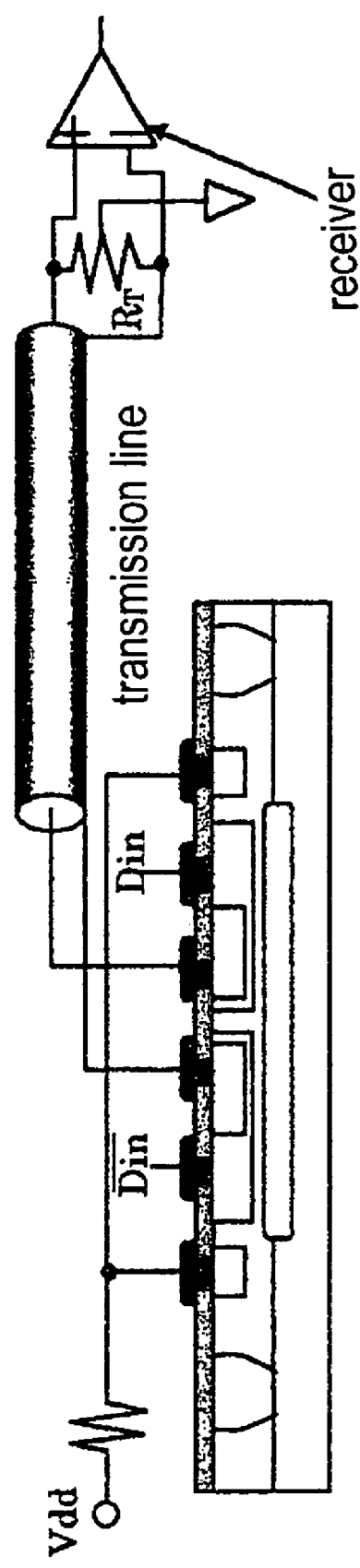
FIG. 6 is a view showing a carrier-reutilization circuit of a bipolar transistor of the present invention.

In the bipolar transistor, a cross-sectional structure such shown in FIG. 6 can be possible. An accumulated small number of carriers at the base are drawn to the collector side at the common collector electrode, and also complementary increase and decrease of a depletion layer electrical charge are compensated by the common collector. Since the drawing by an emitter is the same as in a conventional system, even though the effect of the structure is smaller than the effect in the MOS, the large high-speed operation can be possible, and also the electric power can be lowered due to the reutilization of the electrical charge.

Here, the high-speed operation through the pump up and pump down of the carrier and a principle of the transistor structure will be explained in detail.

The key reason why a transistor does not operate at a high speed is that it takes a long time to discharge accumulated electrical charges existing just before a transition of the transistor and to supply the electrical charges for a distribution of the accumulated electrical charges for a new state. The power source ground is essentially passive, even though the bypass capacitor is supported inside the chip. The power source ground does not aggressively help the supply and discharge of the electric charge of the transistor which actively changes. An increase in a momentary current due to the accumulated electrical charge of the transistor (capacitance component) makes the power supply voltage decline and ground level rise, so that the momentary current is restricted. Also, since the bypass capacitor is generally not arranged adjacent to the transistor, it is less likely to be an electrical charge-supply device urgently required. The problem will be explained with the p-MOS transistor structure shown in FIG. 27.

A reference potential is taken when a voltage of an electrode of the p-MOS transistor is a base B=a drain D=a source S. When a minus potential is applied to a gate G for the reference source potential, an n-channel directly below a gate insulator (channel layer area) is reversed and the holes are evoked, so that the structure becomes such as one shown in FIG. 27. The electrical charges stand face to face between a gate potential and inversion layer potential, so that $C_{ox}$ is formed (electrical charge of the inversion layer in this case is the hole). Under the inversion layer, a depletion layer is generated, and since the electrical charges also stand face to face here, there exists Ci. Due to an electric potential distribution of the well structure by the inversion layer, Cb is also generated under the depletion layer. The full capacitance is referred to as Cmos. With a rise of the voltage, this state is weakened, and the electrical charges are rapidly dispersed. On the assumption that the horizontal axis is the gate voltage and the vertical axis is Cmos, the relationship is shown in FIG. 28. When there is no inversion layer and only depletion layers, the quantity of electric charge becomes the minimum. In other words, the transistor in this case can be considered as a variable capacitance element with a two-end terminals type depending on the voltage.

Furthermore, when the gate potential rises to the plus side, accumulation charges (in this case, the layer directly below the gate is electrons) are accumulated in the channel layer area. Naturally, the amount of the accumulated electrical charges becomes the same as the amount when the holes are accumulated, and the capacitance increases and returns to $C_{ox}$. The value of $C_{ox}$ becomes as follows.

$$C_{ox} = \epsilon_{ox} S / t_{ox}$$

Here, $\epsilon_{ox}$ is a dielectric constant of the gate insulator, S is an area of the channel face, and $t_{ox}$ is a thickness of the insulator. When the lowest value of $C_{mos}$ in FIG. 28 is considered as $C_{min}$, the quantity of the electric charge of $Q_{tran} = 2 V_{swing} (C_{ox} - C_{min})$ has to be poured in from the power source by the inversion of the gate, voltage ($V_{swing}$). In order to invert the electric charge, there is a double coefficient. This is the energy for operating the transistor itself and does not have any relationship with the transistor output electrical charge.

Now, when the signal electrical pressure is 0.5 V, $C_{mos}$=5 fF, $C_{min}$=2.5 fF, and the transition time of the signal inputted into the gate (start-up time or shut-down time) is 25 ps, the quantity of the electric charge with the transition becomes $Q_{tran}$=1.25 fC, so that the transition current $i_{tran}$=50 µA flows for 25 ps. This is additionally required for activating the transistor. With each signal transition, the energy has to be absorbed and discharged at once, and in the circuit wherein many transistors are assembled, when the condition of the power source ground is damaged even only slightly, the transistor can not perform.

Figure 29:
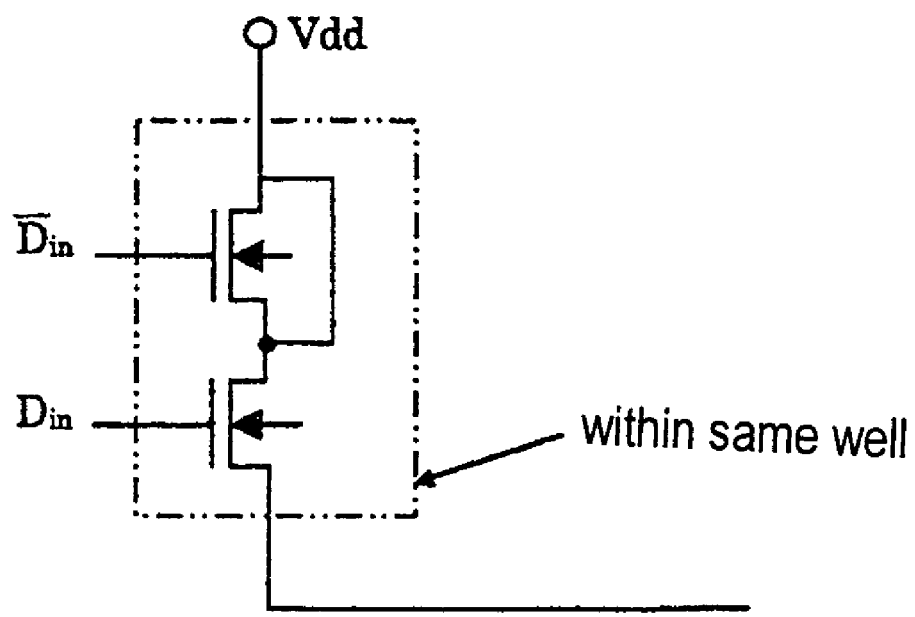
FIG. 29 is a diagram showing an example of a basic circuit with an n-MOS transistor and a varactor.

The voltage of the power source ground is static, and when the current with 50 µA is flowed at once, the power supply voltage drops or ground level rises due to the parasitic inductance of the line. A circuit for making the electric charge required for operating the transistor pump up and down forcibly is required for supporting the high-speed switch of the transistor. There are a large number of the CMOS logic circuits and memory circuits wherein the differential output terminals are provided. In this case, the circuits can receive all the input signals by the differential. The basic circuit with the structure of the n-MOS transistor and the varactor shown in FIG. 29 will be explained. The n-MOS transistor and varactor are the exactly same size and driven complementarily.

Figure 27:
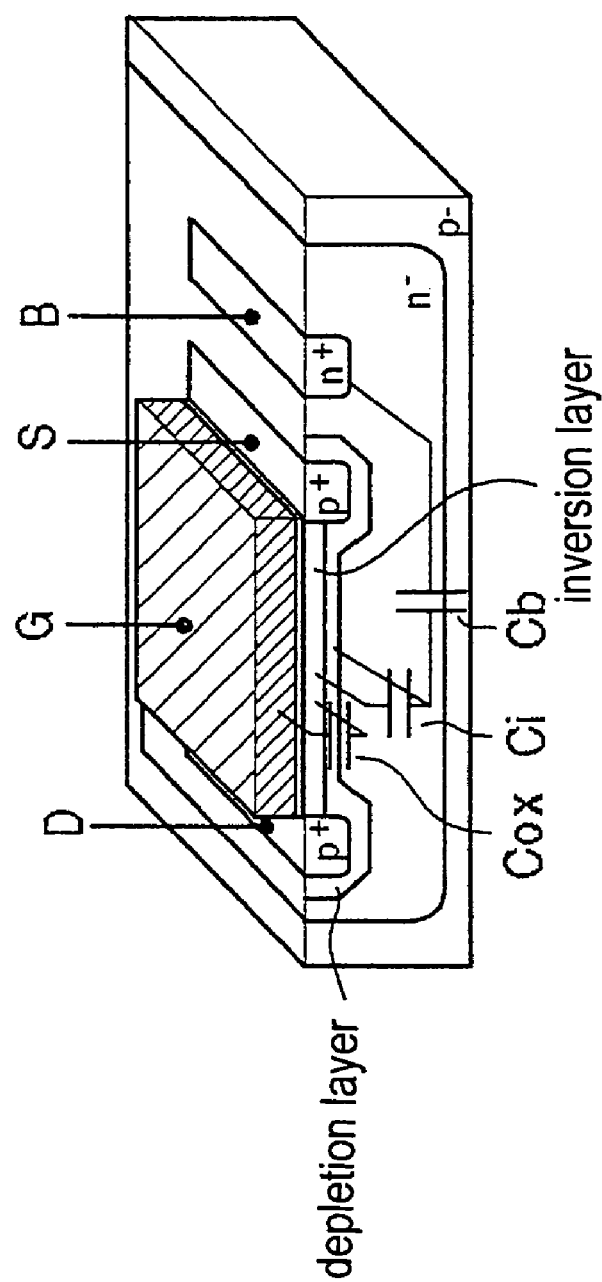
FIG. 27 is an explanatory diagram of a structure and a capacitance component of a p-MOS transistor.
Figure 28:
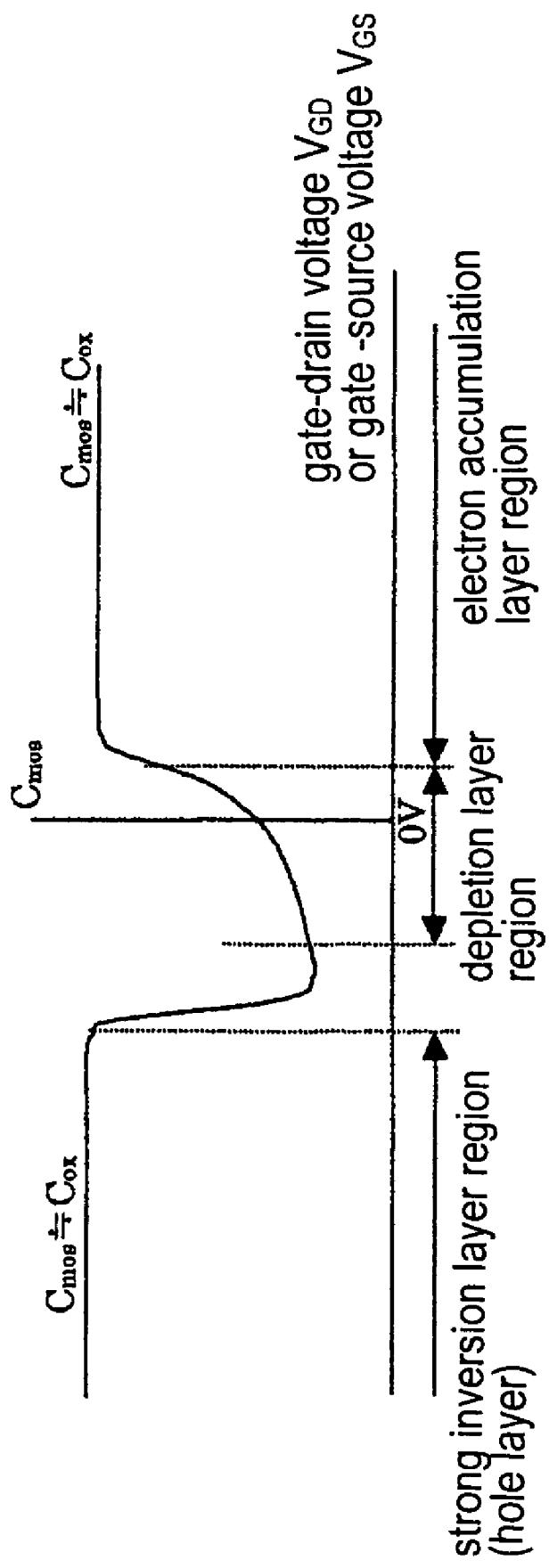
FIG. 28 is a chart showing a relationship between a gate voltage and a p-MOS varactor capacitance.
Figure 30:
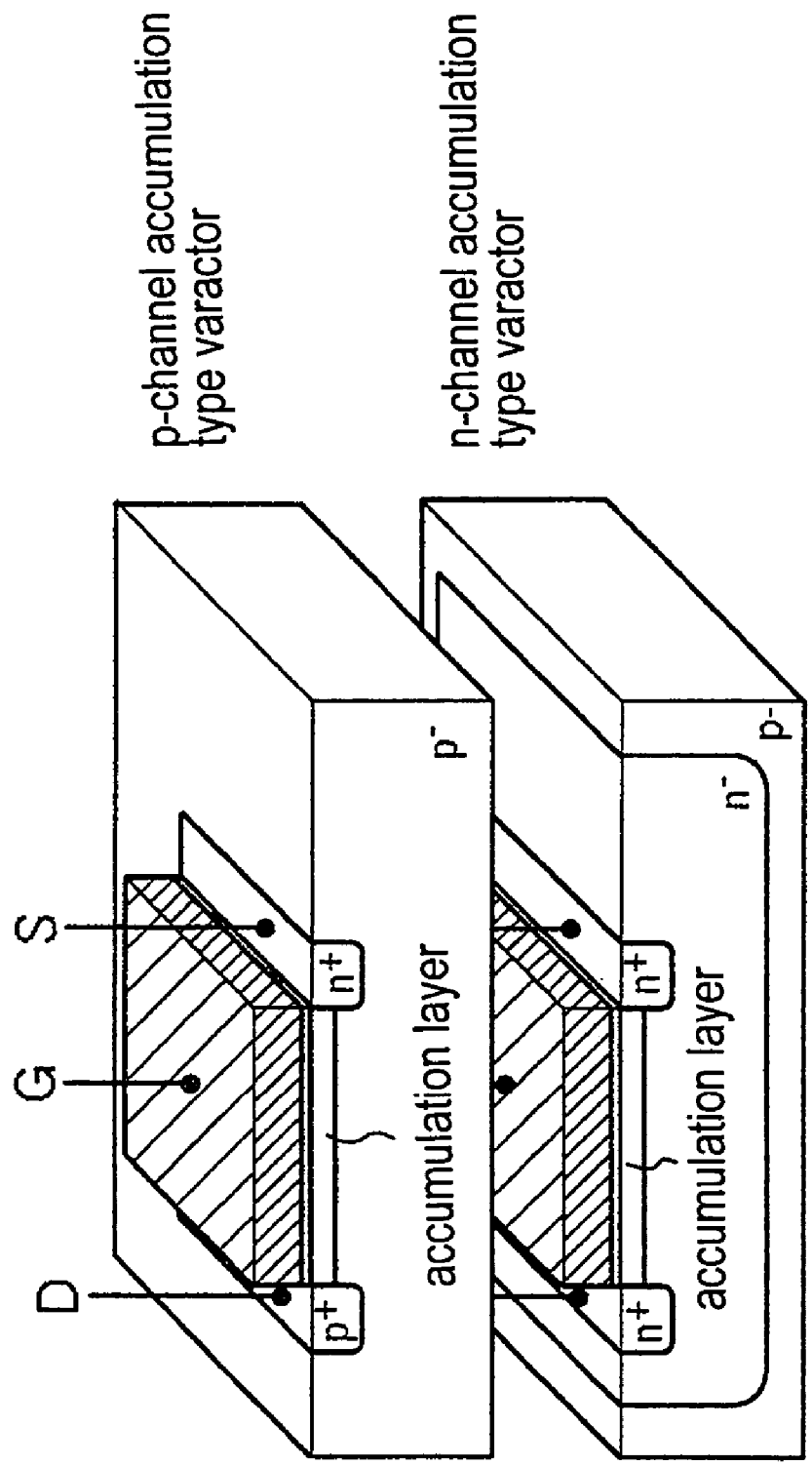
FIG. 30 is a view showing a structure of a CMOS varactor.
Figure 31:
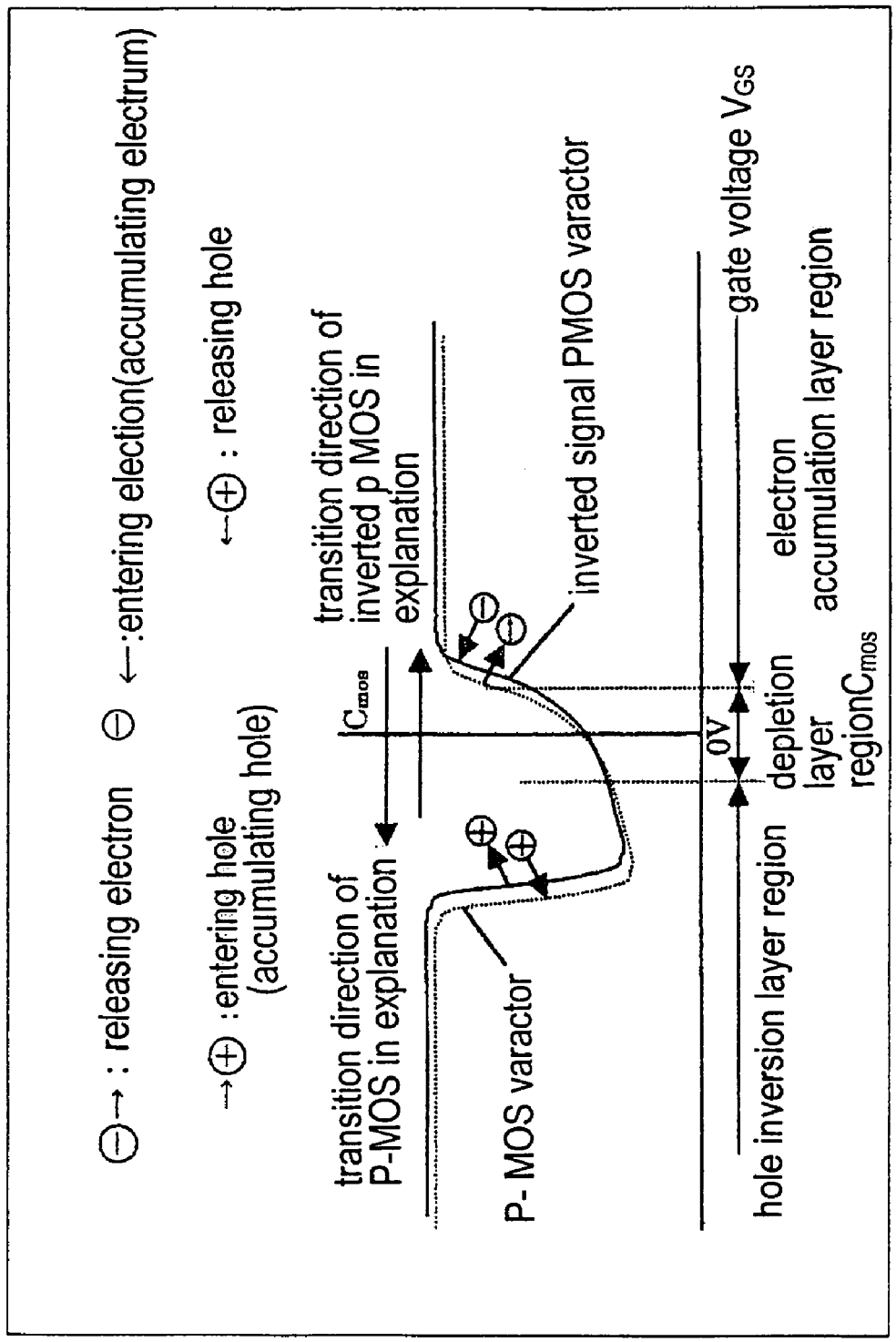
FIG. 31 is a chart showing a relationship between a p-MOS and a gate voltage.
Figure 32:
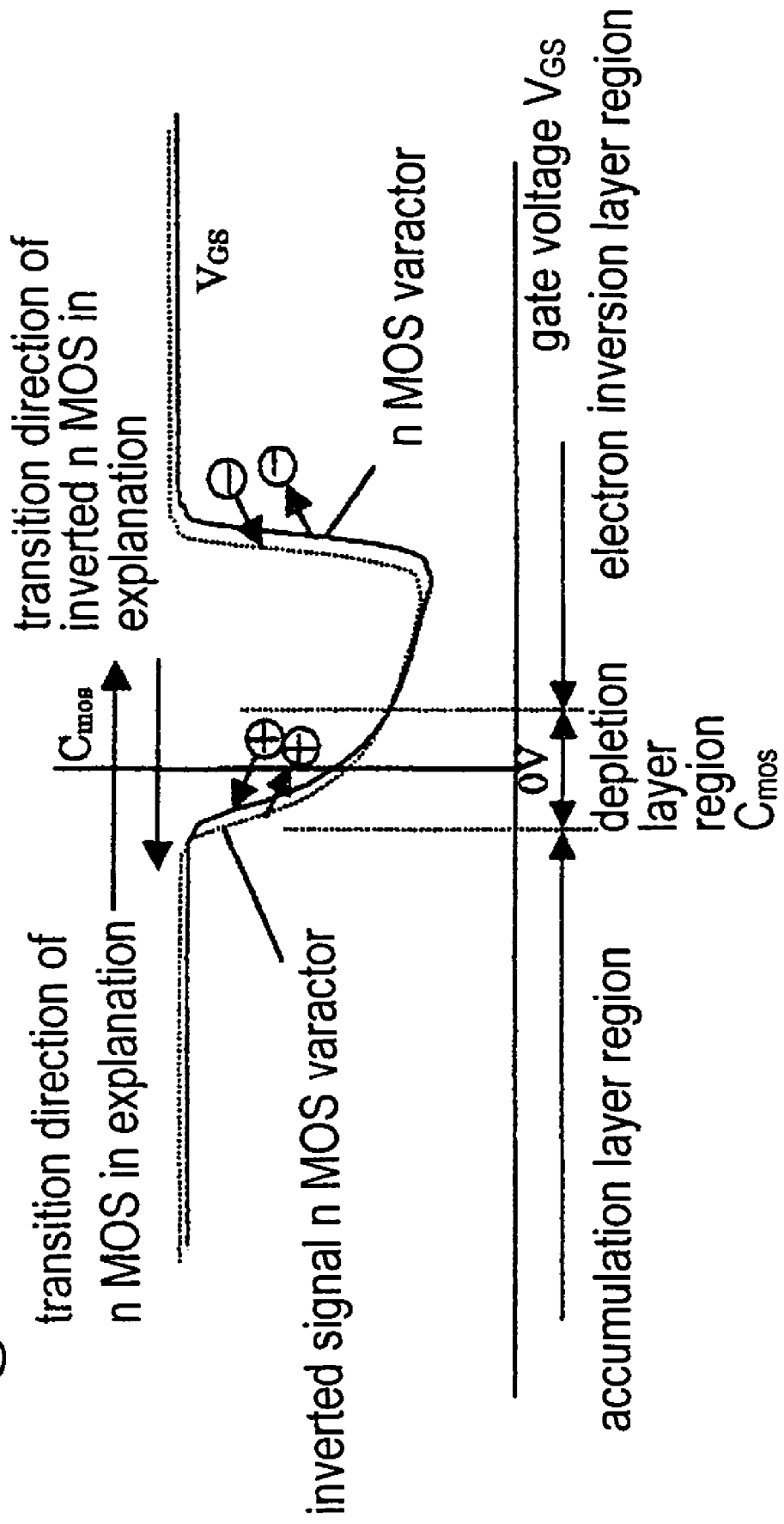
FIG. 32 is a chart showing a relationship between an n-MOS and a gate voltage.

When the varactor in the same size as the CMOS transistor (circuit element with two end terminals connecting with the source electrode and drain electrode of the FET) is designed based on the P-MOS transistor shown in FIG. 27, the varactor with the structure similar to the CMOS transistor shown in FIG. 30 and the complementary characteristic can be presented. As is clear from this, when the MOS transistor requires the electric charge due to the complementary differential signal, the varactor capacitance decreases due to the change of the voltage provided with the gate as shown in FIGS. 31 and 32. The electric charge equivalent to the decreased capacitance, i.e., the electron or the hole that the MOS transistor requires, is discharged. This flows in from the source electrode or the drain electrode, and the accumulated electric charge required at the time of transition of the MOS transistor is supplied at once. The time when the MOS transistor has to discharge the electric charge is the time the same varactor requires the electric charge, so that the varactor strongly absorbs the electric charge. As a result, the excellent circuit controlling power consumption can be provided because of the ability to reutilize the accumulated electric charge.

In the varactor, transistor, or switched-type driver such as the CMOS-FET, since a quick change between + and − electric charges is operated inside the common well of the element operating complementarily, it is desirable to electrically float the common well (not connected to GND or power source). However, depending on a circumstance, there is a case to connect the common well to the GND or power source at the expense of the operating speed in order to decrease disturbing noise.

Figure 7:
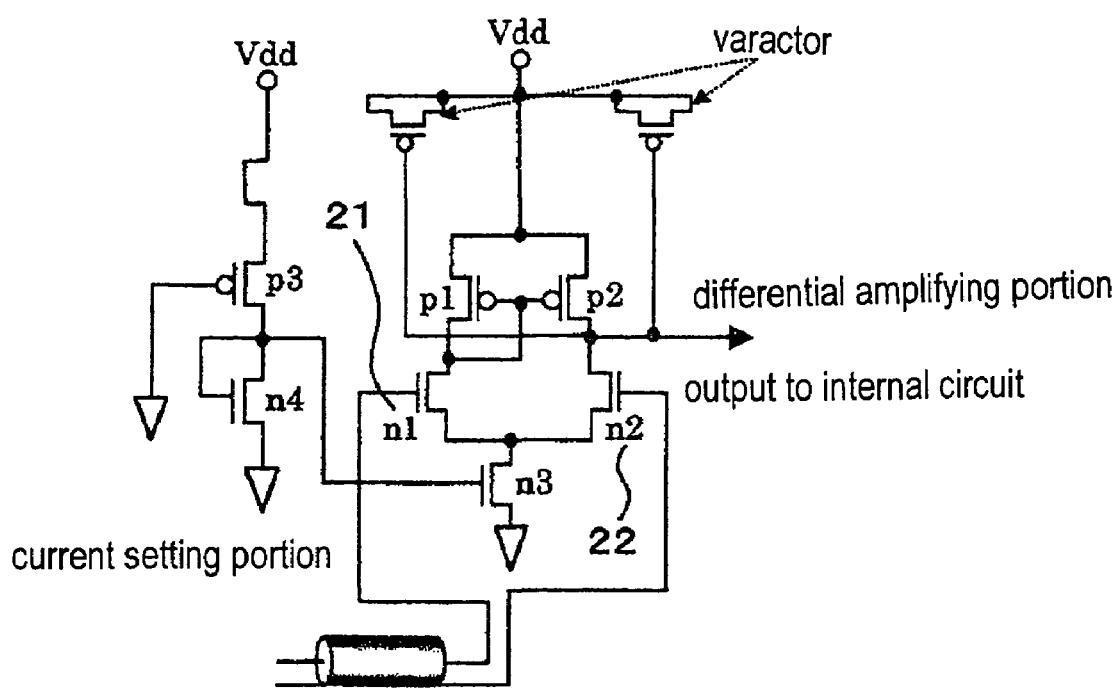
FIG. 7 is a diagram showing an example of a circuit of a receiver end of the present invention.

An example of the receiver end circuit is shown in FIG. 7. The differential receiver transistors n1 and n2 (21 and 22) may have the common sell structure or common collector structure (in case of using the bipolar) similar to FIGS. 5 and 6 for inverting the signal input, so that the high-speed operation can be possible. Since numbers n3, n4 and p3 are static transistors, a conventional circuit can be used. By using the inversion operation of n1 and n2 as shown in FIG. 5, the varactor may be set as shown in FIG. 6, so that the high-speed operation and power-saving operation can be possible. The number p1 and the left varactor, and the number p2 and the right varactor may be in the same well structure.

Figure 8:
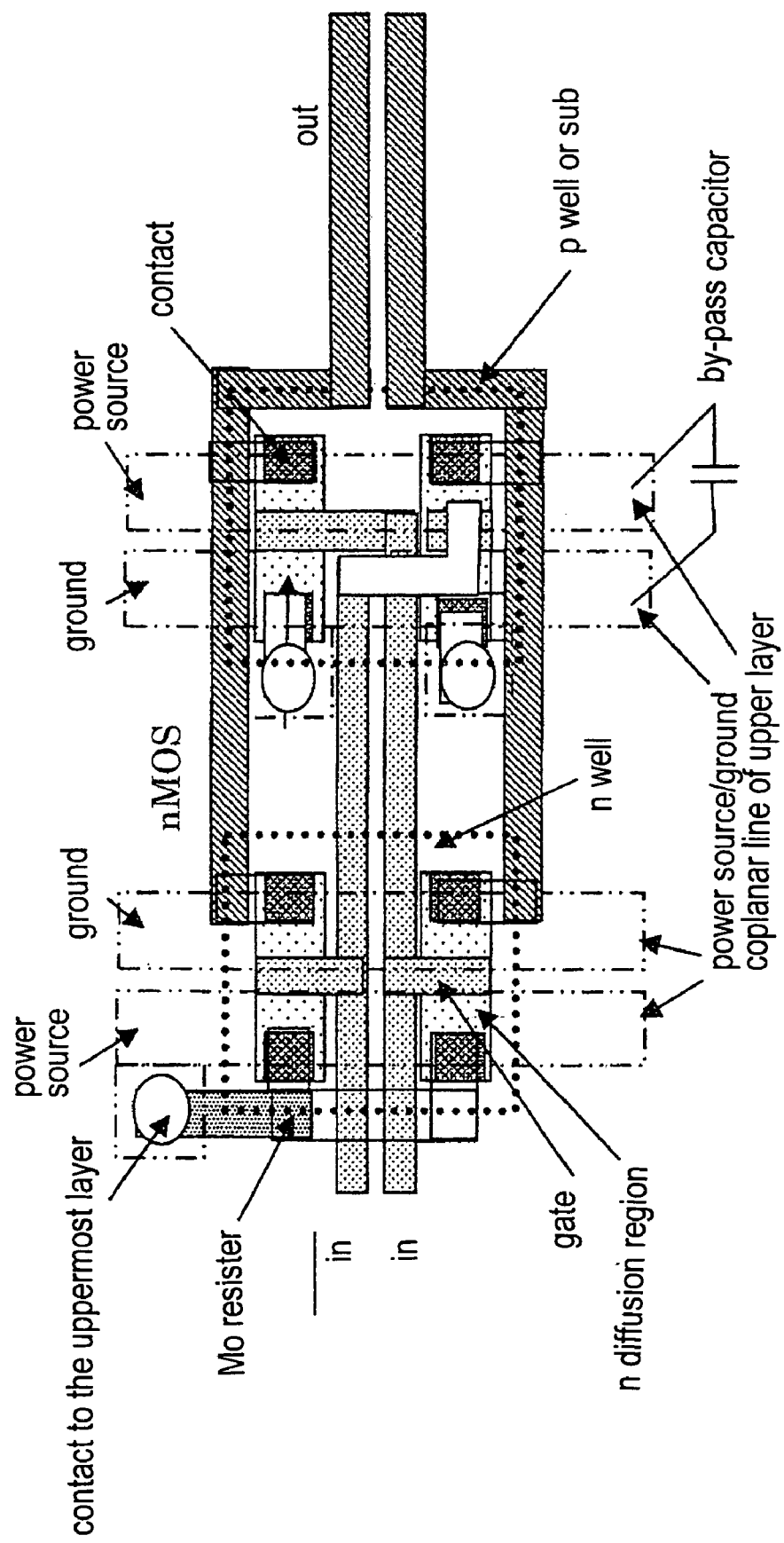
FIG. 8 is a view showing an example of a planar structure of the driver.

The wiring structure is shown in FIG. 8. An important feature of the design is that the input signal is the pair transmission line, the output line is also the transmission line, and the power source ground pair is the transmission line (upper layer) as well (all are the pair coplanar line). Another important feature is that the transistors which became a pair due to the differential input are in the same well structure.

Figure 9:
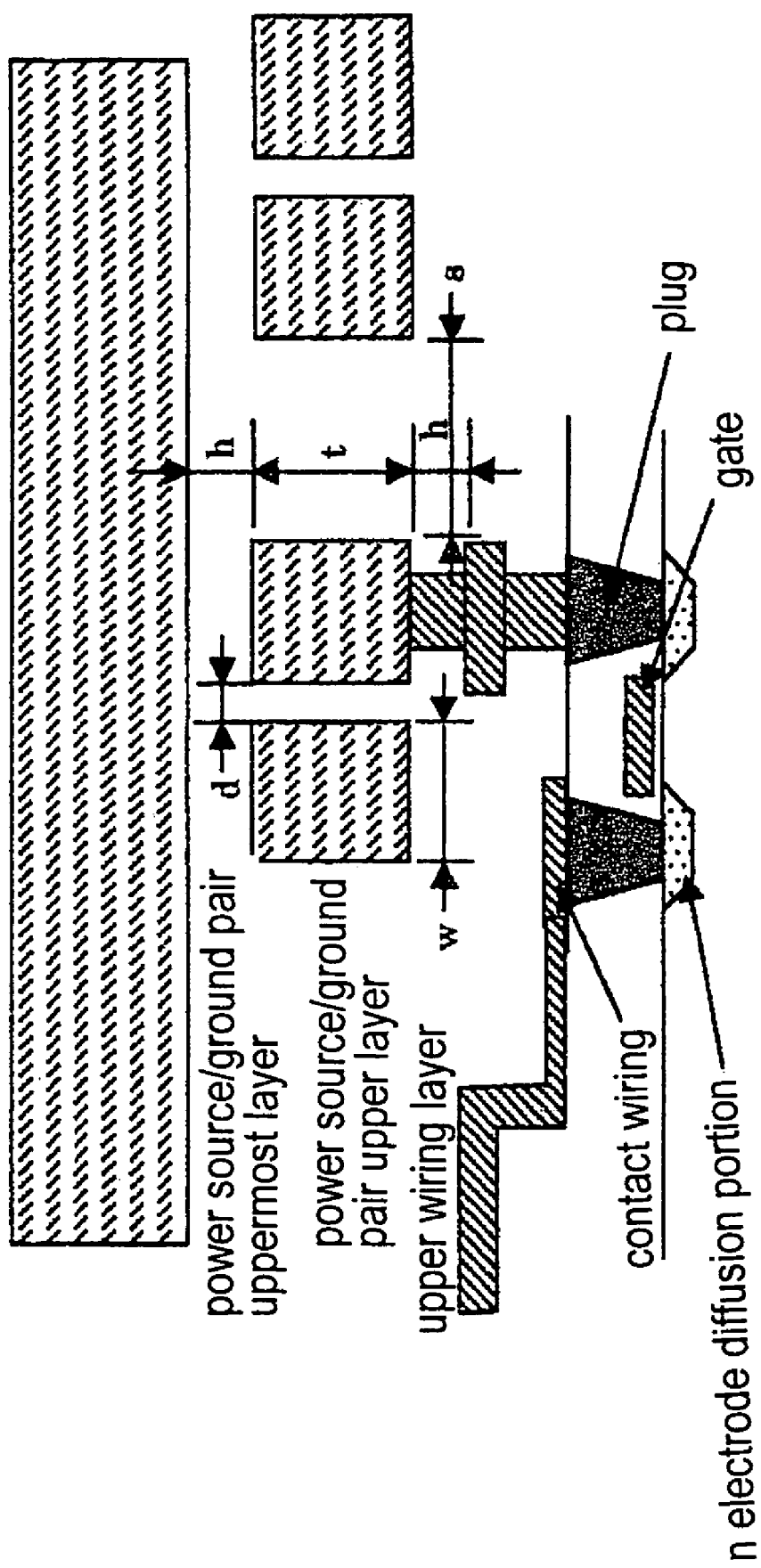
FIG. 9 is a cross-sectional view showing an example of a structure of a driver transistor portion.

The power source ground layer is disposed in the third layer along each transistor array as the pair coplanar line as shown with phantom lines. FIG. 9 shows a cross-sectional structure in order to show the wiring structure clearly.

First, a cross section of the coplanar line (30) of the upper power source ground will be explained. In order to strengthen the coupling between the power source and ground, it is preferable that an aspect ratio is t/w≧1.5. By increasing an opposed face, the coupling between the power source and ground is strengthened, so that the leakage of the electromagnetic field to the outside becomes lower. Next, in order to strengthen the coupling inside the upper power source ground pair layer, it has to be set that a fringe of the electromagnetic field on the opposed face does not cross over across the layer as much as possible. In other words, in order to avoid a cross talk, a condition of d<h has to be met. Thirdly, in order to avoid the effect of the fringe, a condition of s/d≧1.5 has to be met. The same condition has to be applied to all the pair coplanar lines (signal line, clock line). It is preferable that all the wire connections of the logic or memory transistor of the LSI operating with the clock frequency higher than a few GHz have this kind of structure as well as the driver or receiver structures. Obviously, this wiring rule is preferably applied across all the global wirings of the chip.

As shown in the example in FIG. 2, in the process wherein the output of the driver passes a main line bus and reaches the transmission line, the pair line is not connected to the common ground at any location, and exits as an independent line from ground through a resistance. The effect is that the pair signal lines swings complementarily and the maximum amplitude effective for a differential amp receiver can be obtained. An additional effect is that a disturbance of the electromagnetic field of the transmission line becomes the minimum level, so that the waveform is not disturbed. Also, a circuit for minimizing the parasitic inductance and parasitic capacitance can be provided.

The important feature here is that ground for the signal line is paired with the signal line and can not call ground, so that ground for the signal line can not be connected to the common. In order to match the level with other signal (not to have a bias difference), the signal is dropped on ground at one place. However, it is not exactly necessary. The reason for limiting one place is to prevent the complementary current in ground from passing another ground loop and being a branch. If this is called a loop current or an eddy current, this current causes the EMI and the present invention prevents this problem.

For example, a micro-strip line is a structure wherein a strip line is wired through a dielectric member relative to a common ground. A distribution of an electromagnetic field between the strip line and the common ground is joined with other strip line through the common ground, and interferes with the other strip line. However, since ground for the signal line of the invention is a pair with the signal line and separated from the common ground, ground for the signal line does not basically interfere with other signal line through the common ground. This is the effect that ground for the signal line separated from the common ground is provided. In this invention, the center of a stretch of the electromagnetic field is the cross-sectional center of the pair transmission line (signal line and ground line for the signal line).

Figure 38:
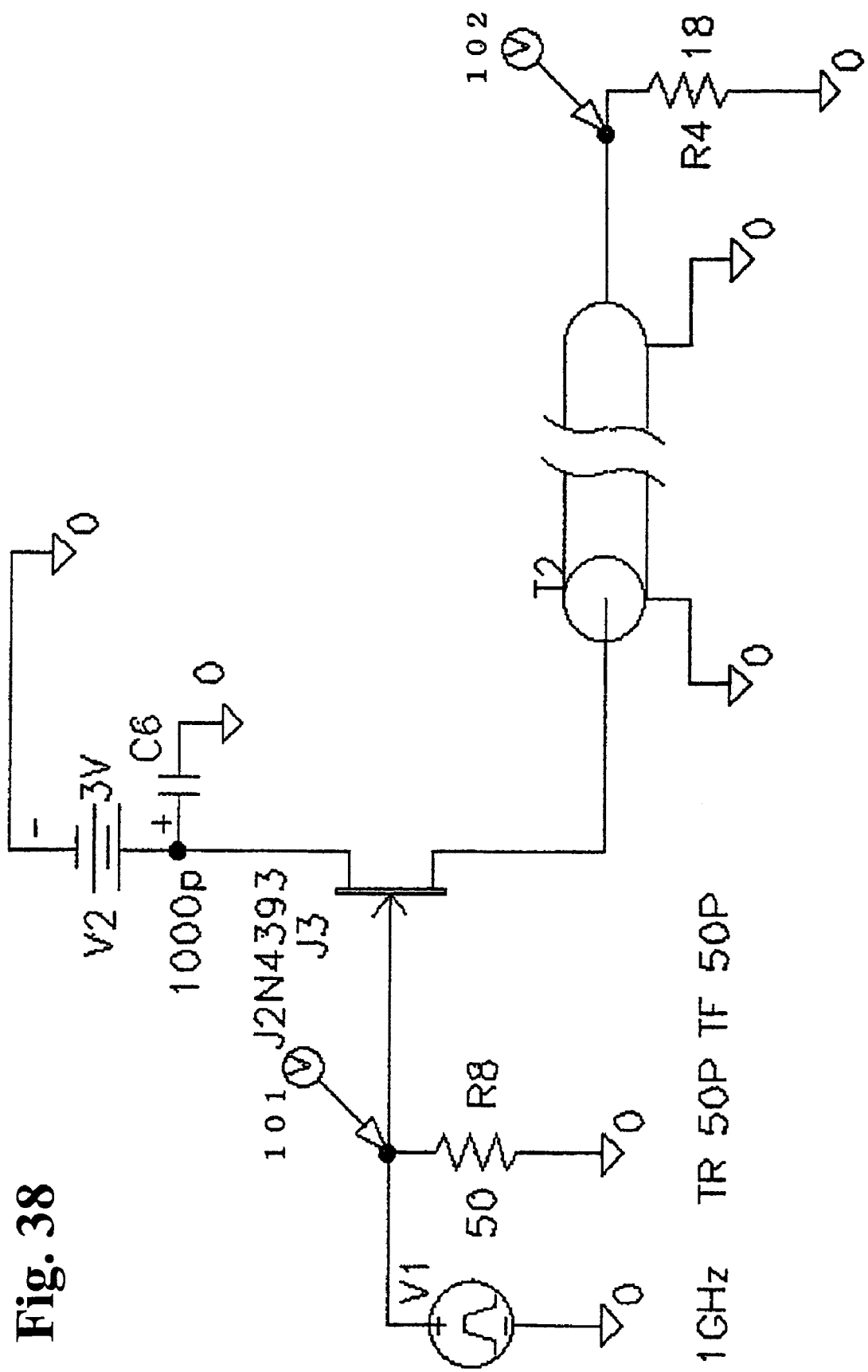
FIG. 38 is a diagram showing an example of a basic switch circuit with a single FET wherein only a sending end and terminal end are dropped to ground.
Figure 39:
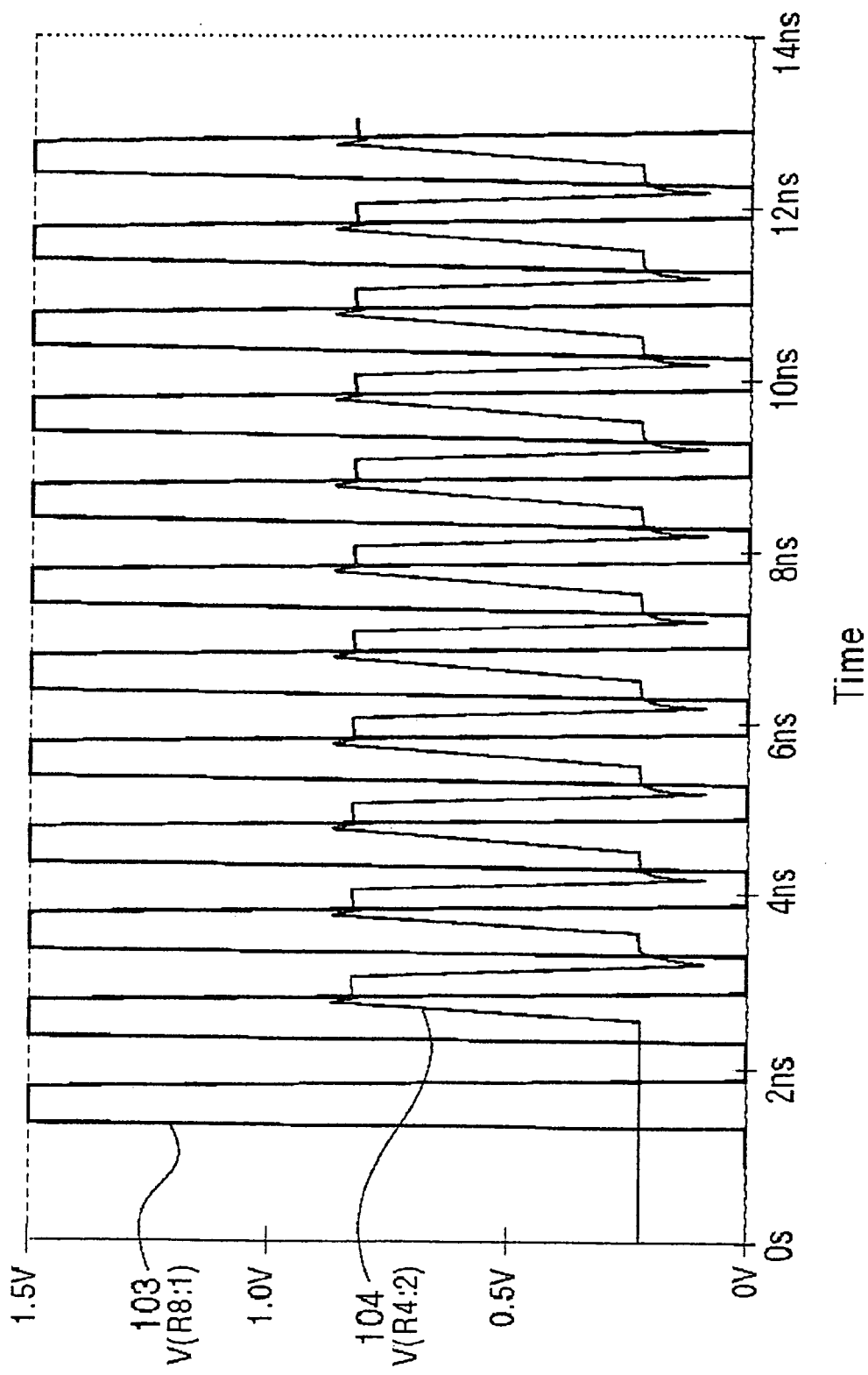
FIG. 39 is a chart of a waveform of the circuit shown in FIG. 38.

FIG. 39 shows a simulation result of a basic switch circuit shown in FIG. 38 with one FET having only the sending end and terminal end dropped on ground. In FIG. 39, as compared with the waveform 103 of the sending end 101 shown in FIG. 38, an output amplitude of the waveform 104 of the receiving end 102 shown in FIG. 38 lowers due to partial pressures of the eternal-end resistance and the FET-on resistance. Although a spike is generated in the capacitance of the FET, it is clear that 1 GHz pulse is running through. However, there-is an issue of dealing with ground of the transmission line (T2).

Figure 40:
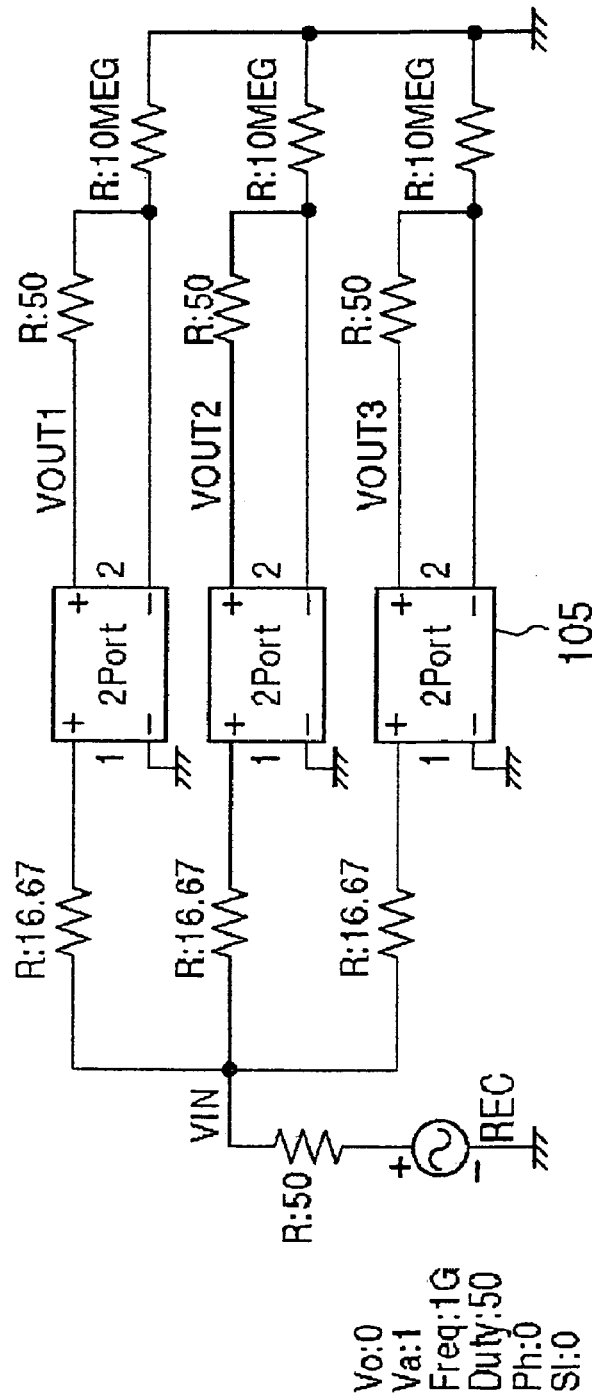
FIG. 40 is a diagram showing an example of a transient analysis circuit of a measurement substrate.

Next, simulation analysis results are shown in FIGS. 40 and 41, in which an S-parameter actual measurement of a micro-strip line MSL and stacked-pair line SPL with a 230 mm line length (line/space=1/1, characteristic impedance approximately 50 Ω). In the simulation with 1 GHz, both circuits are only dropped on ground at the input side and floated with a resistance of 10 MegΩ at the output side. In FIG. 40, actual measurement S parameters are inputted into circuit parts 105 called 2-Port, and materials are FR-4, BT-resin, and Teflon (registered trademark).

FIG. 41 shows that a sending waveform 106 becomes receiving waveforms 107, 108, and 109. Herewith, even though a transmission line T2 is floated, the simulation of the above-mentioned line shows that the waveform of 1 GHz can run through in either of the micro-strip line MSL and the stacked-pair line SPL. As a result, ground may be dropped at one of the input and output.

FIG. 10 shows a structure of the transmission lines used in the above-mentioned circuits as a pair. In the pair coplanar and the stacked-pair, a distance between the adjacent pair lines has to have an enough space larger than twice (2S) based on a space of the pair lines. A guard-coplanar line and guard-stacked-pair line can be designed with the adjacent wiring space (S) larger than one time based on the space of the pair lines. An advantage of a line with a guard is that the characteristic impedance of the transmission line can be lowered within an appropriate designing range.

In order to meet conditions of the TEM wave transmission, the transmission lines have to be surrounded by a homogeneous insulating material. In the pair coplanar and stacked-pair, a covering range is a stretch of 2s (FIG. 10) same as the stretch of an effective electromagnetic field from an outer circumference of the conductor. In the guard coplanar and guard-stacked-pair, since the effective electromagnetic field is stayed inside the guard, the range is a stretch of s.

Figure 11:
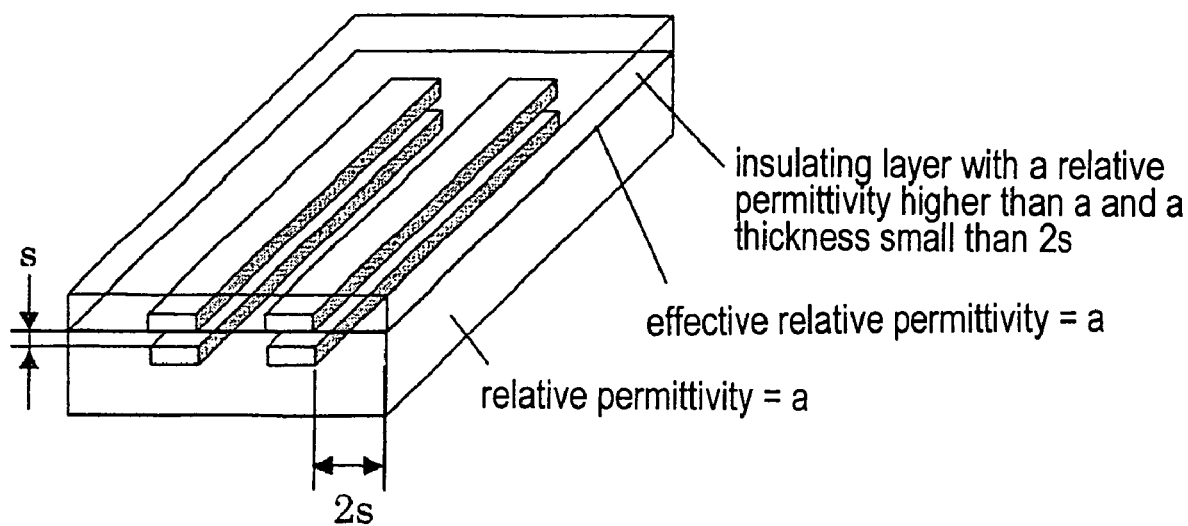
FIG. 11 is a view showing an example of matching an effective dielectric constant of an insulating layer around a conductor in a heterogeneous insulating layer.

In a case that the stretch of the insulating layer can not be provided, a countermeasure is proposed as shown in FIG. 11. An example of the stacked-pair line is shown. This image is a printed circuit board and shows a top-layered part of a solder resist. Since the solder resist is thin, an electric flux line stretching over an upper part reaches an air layer (relative permittivity 1), so that the effective relative permittivity of the solder resist becomes smaller. In the present invention, when the relative permittivity of the lower insulator is a (a>1), the solder resist with the large permittivity is used in such a way that the effective relative permittivity of the solder resist becomes a. Herewith, the transmission line can substantially maintain the TEM wave mode. In the pair coplanar and stacked-pair line, when there is a different kind of the insulating layer or air layer within the 2s range, the layer structure is adjusted in a way that the substantial relative permittivity is the same relative permittivity within the stretching range. Also, in the guard coplanar and guard-stacked-pair line, the above-mentioned same rule is met within the range of the stretch s. A specific size is presented with the printed-wiring board, and the stacked-pair line is presented with a model. Since the effective electromagnetic field is closed with 2s, when a thickness of the solder resist is ($\frac{1}{2}$) s, ($\frac{3}{2}$)s (i.e. 2S-$\frac{1}{2}$S) of the electromagnetic field leaks into air. Since the relative permittivity of air is 1, when the relative permittivity of the solder resist is b, a simple expression is $1\times(\frac{3}{2})+b\times(\frac{1}{2})=a$. However, the stretch of the electromagnetic field becomes weaker in proportion to square of the distance from the center, so the actual measurement is approximately b=2a.

Figure 12B:
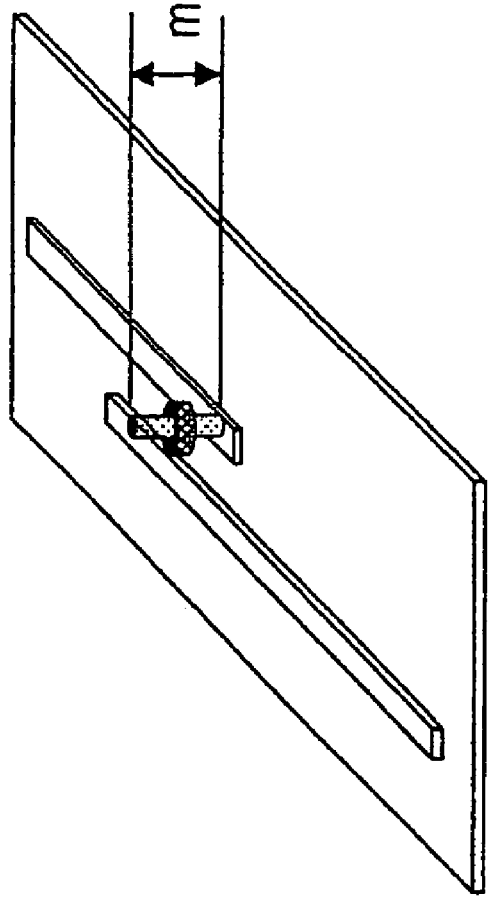
FIG. 12 is a view showing a model of an impedance mismatch length in a column or veer hole.
Figure 12A:
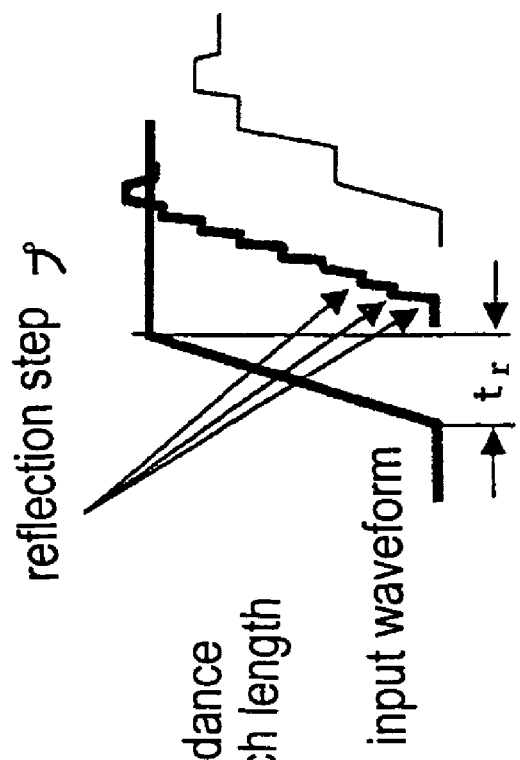

Next, as shown in FIG. 12(a), a length of an impedance mismatch such as the column or veer hole will be explained.

Figure 13:
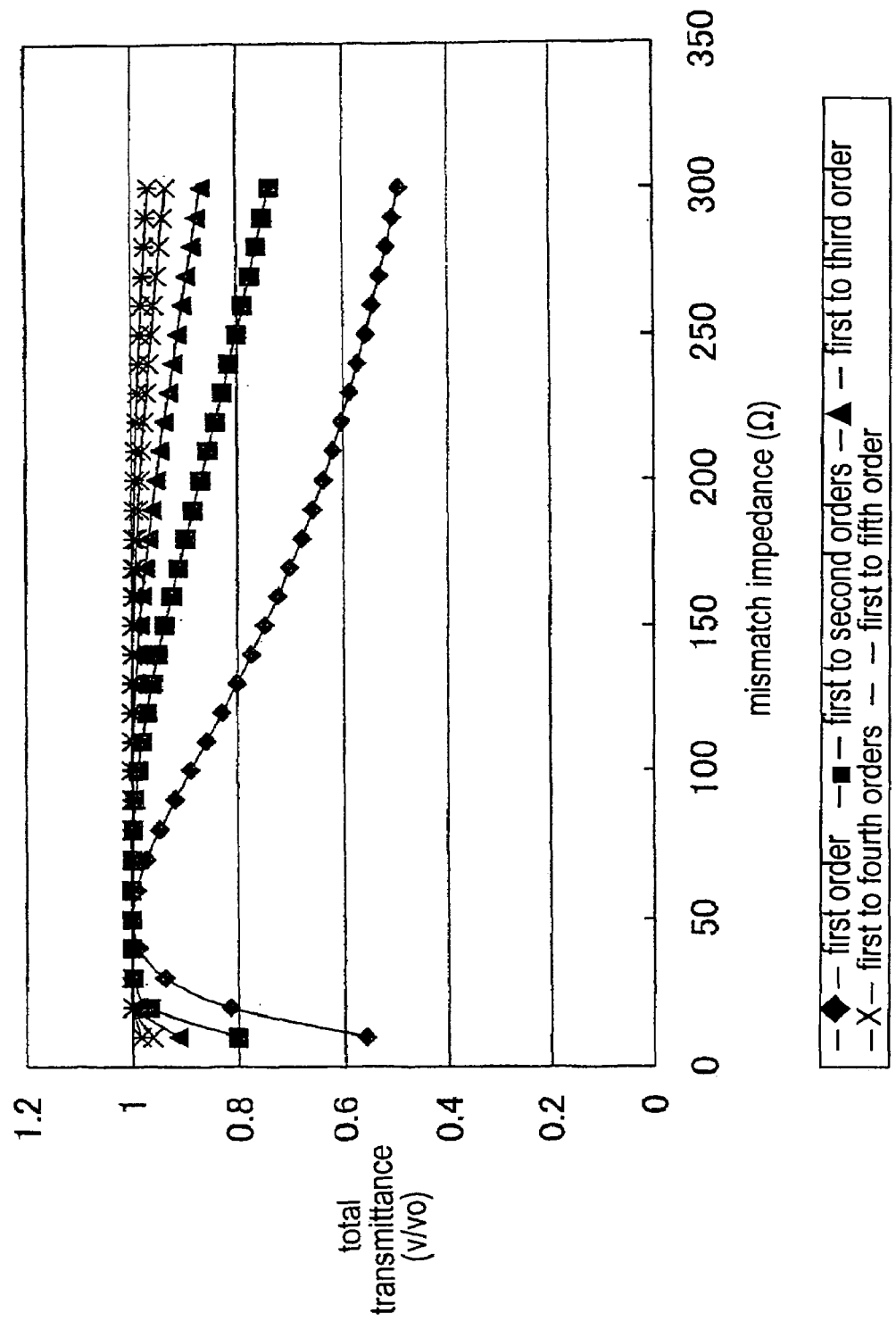
FIG. 13 is a chart showing total transmittance of multi-order reflection energy and mismatch impedance based on 50 Ω.

When the relative permittivity of the insulating layer inside the chip is 3, the electromagnetic wave transmission speed is $1.73\times10^8$ [m/s], and the transmission delay with 100 μm line is 0.578 ps. This can be interpreted that since the start-up time of the pulse of the main line is 10 ps, the following result is taken place. Even energy flows into the mismatching part, the return of the energy is 0.578×2=1.156 ps, and the energy can travel back and forth 8.5 times in 10 ps. Due to the reciprocating adjustment, the energy almost reaches a stable field during the start-up time (FIG. 12(b)). Therefore, even though there is a disturbance in the waveform during the start-up time, after the star-up time, the stable waveform passes through the mismatching part, and then progresses in the wiring. As shown in FIG. 13, from energy point of view, after the time required for three round trips has passed, 90% of energy transmits even with the mismatch (inconsistence) of 50 Ω/200 Ω. In conclusion, this length can be ignored. In other words, since the effect of the inconsistency can be ignored when the delay time tpd of the inconsistent part is 7 tpd<tr, so that a structure with tr>7 tpd is proposed.

Figure 14:
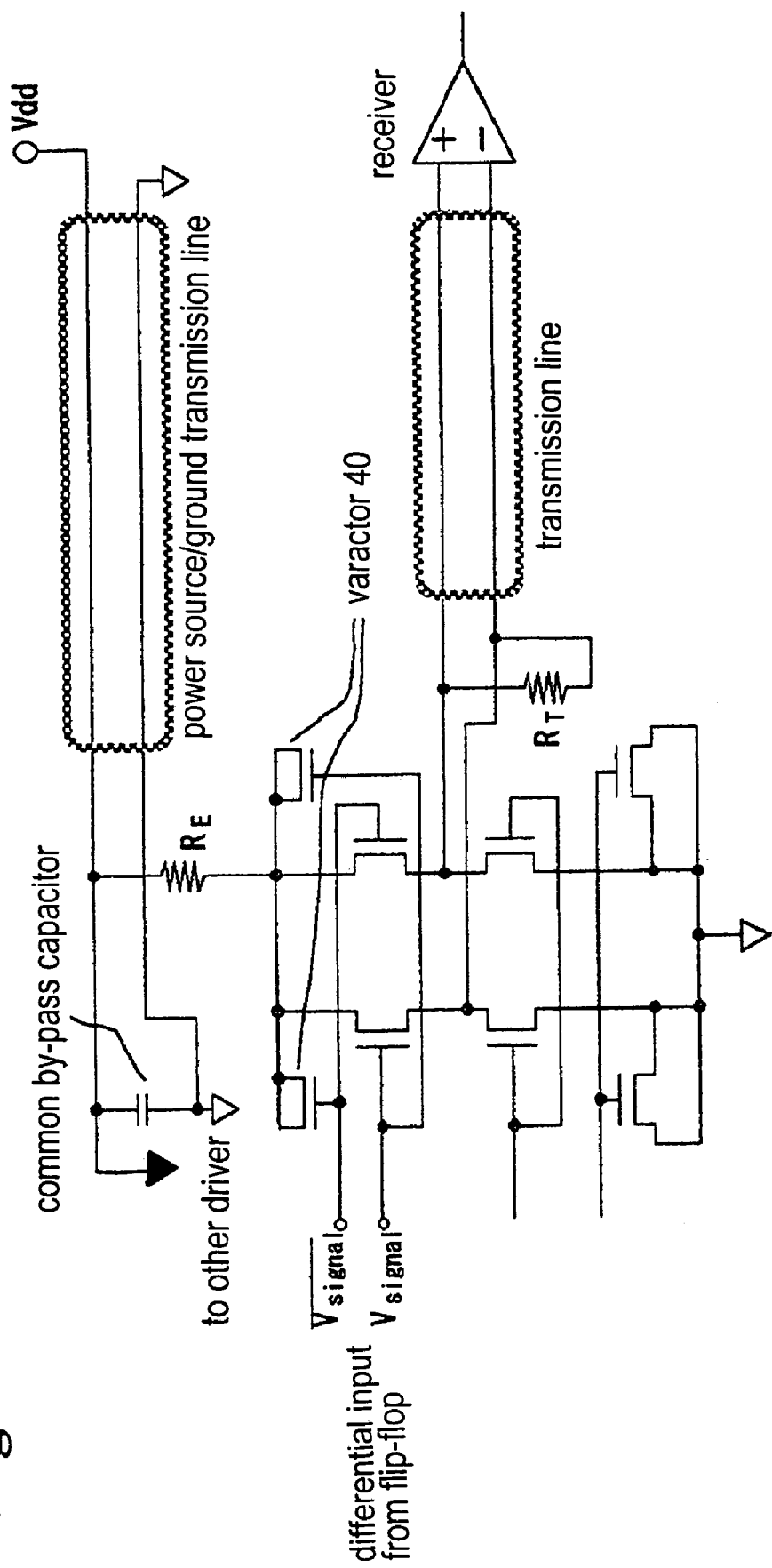
FIG. 14 is a diagram showing an example of a bus-switch type driver.

Here, as a structure of the bus-switch-type driver, a varactor element insertion circuit is proposed. FIG. 14 shows an example of the varactor element insertion circuit. Here, the varactor is composed of the same structure with the MOS transistor, MES transistor, or bipolar transistor, since the varactor is simultaneously made in the same process of producing the LSI.

Additionally, for a buffer of the front step of the driver, the differential output circuit with the power source (as shown in FIG. 2) may be used.

System Structure

The driver receiver transmission system device and circuit parts have been explained. Next, a structural part composing the system for this purpose will be explained. First, an ideal structure is to be connected with the isometric parallel wiring and the pitch thereof as shown in FIG. 15. A circuit is attached for detecting a return voltage waveform at eternal-end resistances (51) absorbing a return signal of total reflection at the sending end. The waveform is analyzed, and the sending waveform is corrected after feeding back to a genetic-algorithm circuit (52).

Although the preferable transmission line structure inside the chip is the coplanar line, since a vertically long cross-sectional structure with a large aspect ratio can not be used due to a package or printed-wiring board, the stacked-pair line is preferable here. FIG. 15(a) is a plan view of the chips in see-through. The chips extend to chip pads (54) from drivers (53) through the coplanar lines, and are connected to the wiring board by a flip chip connection. The signal line under the pad layer and ground line are connected to each lower layer at the veer hole with a flip chip pad, and overlap within short distances as short as possible. A cross-sectional structure is shown in FIG. 15(b). Preferably, ground layer should have 1.2~1.5 times larger than the line width w in order to prevent a top and bottom gap of the stack or a leak of the electromagnetic field to the lower layer. Other relationship are w≦s, (d+t) ≦s/2, d≦$h_1$, and d≦2 $h_2$. Receiver pads (55) are provided at an equal distance from the drivers, and connected to the receivers. It is preferable that the short wiring is the stacked-pair line inside the package, and the coplanar line inside the chip. FIG. 15(a) shows with hidden lines since the second and third receivers are overlapped. Obviously, although there are several diverging pads and receivers, they are omitted. The terminal resistances (57) are connected to the terminal ends of the lines, and match with the line characteristic impedance. As can be seen from the cross-sectional structure, the straight lines connected to the power source and ground are provided under the stacked-pair lines.

At a branch, receiver chips (56) are crossing over the bus wiring as shown in FIG. 15, so that the transmission line length can be made as short as possible. There are the following requirements of the structure from the pad arrangement of the driver chip and receiver chip as shown in FIG. 16.

(1) The stacked-pair wiring has to be extended at a pitch double of the pad pitch, and the pads have to be aligned in line perpendicular to the bus line direction.

(2) Since the signal line is taken out of the one-line pad of the chip, conditions of being connected to the other side become restricted.

These two restrictions raise a problem for a designer. When an area of the chips shrinks due to modification, the pad pitch has to be shrunken as well. Also, when the wiring pitch shrinks due to a technical improvement of the printed-wiring board, the chip-pad pitch has to be shrunken in a similar fashion. The driver chip and memory chip are modified at a different timing, so that it is difficult to find a matching condition. As a result, technical modification affecting reliability most is required for shrinking the pad pitch, and this is difficult.

Figure 17:
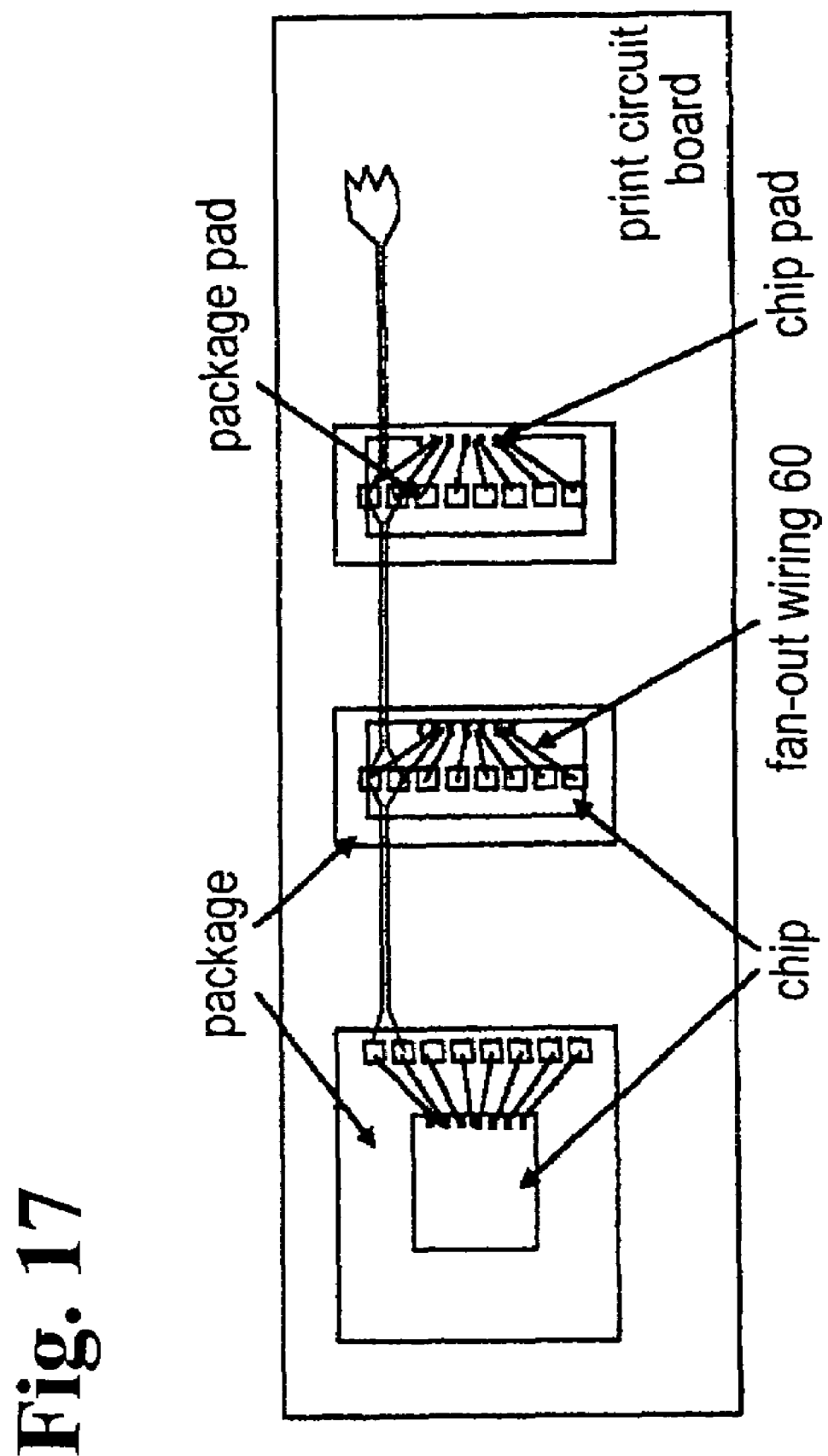
FIG. 17 is a diagram showing a fan-out wiring structure when a package is used.

Consequently, although there is a tentative solution by using the LSI package as an interposer, extension of the diverging wiring length or a fan-out wiring (60) as shown in FIG. 17 are required. Even though the extension of the wiring can be managed by fitting within the restricted range, the fan-out structure presents a problem to simultaneous reception as the fundamental rule of the isometric wiring is not available. When the fan-out wiring is designed such that the wiring width expands, the characteristic impedance is changed. The present invention proposes a structure for solving these problems.

Although the drawing is not shown in a way of the stacked-pair line as a matter of convenience, FIG. 17 shows that both the fan-out structure inside the package and the wiring on the printed-wiring board are the stacked-pair line. The size of the line of the printed-wiring board can be larger than the fan-out line, and also the size can be freely set through adjusting a divergence angle of the fan-out. In other words, since it can be designed separately from the chip-pad pitch, the use of the package has been the mainstream of the existing technology. The high-speed signal systems are required to have the same characteristic impedance across all the lines and have equal length wirings.

Now, on the basis of the characteristic impedance of 28 Ω, when w=200 μm, εr=4.5, the approximate expression of the characteristic impedance of the stacked-pair line (Harold A. Wheeler) (see the symbols in FIG. 15) gives d=39 μm.

$$Z_0 = \frac{377}{\sqrt{\varepsilon_r}} \left( \frac{w}{d} + \frac{1}{\pi}\ln 4 + \frac{\varepsilon_r+1}{2\pi\varepsilon_r}\ln\frac{\pi\varepsilon_r\frac{w}{d}+0.94}{2} + \frac{\varepsilon_r-1}{2\pi\varepsilon_r^2}\ln\frac{\varepsilon_r^2}{16} \right)^{-1} \quad [\Omega]$$

Here, although there is the diverging pad, the bus structure is the same until the terminal end, and the mismatching of the characteristic impedance does not occur. Based on the parallel isometric wiring, the pad pitch is w/2=100 μm, and this is designable by the current technology. The ideal layer structure is that the thickness of h2 is 60 μm, i.e. a standard of the printed-wiring board prepreg.

On the other hand, the package wiring is required to be designed according to the chip-pad pitch. Here, when the chip-pad pitch is 50 μm, the stacked-pair wiring w on the package is 100 μm. According to the above-mentioned expression, d=19.5 μm, so that the transmission line design is 28 Ω from the chip pad to the terminal end resistance. However, since the wiring length of the fan-out part differs, the structure shown in FIG. 18 is proposed.

Figure 18:
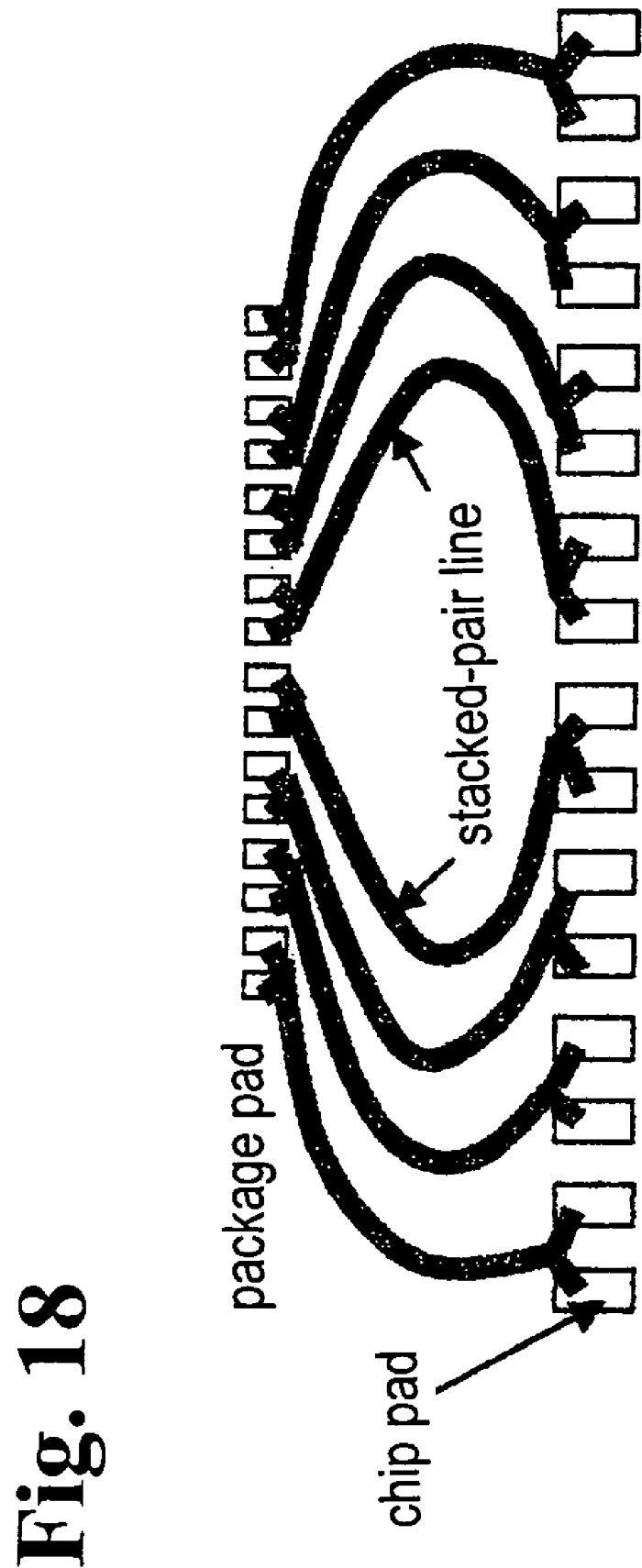
FIG. 18 is a diagram showing an example of an isometric fan-out wiring.

Although a meander wiring with a zigzag meandering structure is often used as a conventional example of the isometric wiring as opposed to the fan-out wiring, this makes the transmission characteristic complicated in the electromagnetic field due to an adjacent effect, so that the present invention is arranged such a way that the circular arc is isometric as shown in FIG. 18. Since there is no zigzag reflection such as the meander, smooth transmission can be possible, and also the distance between adjacent wirings can be relatively large, so that it is also advantageous for the cross talk.

Figure 19:
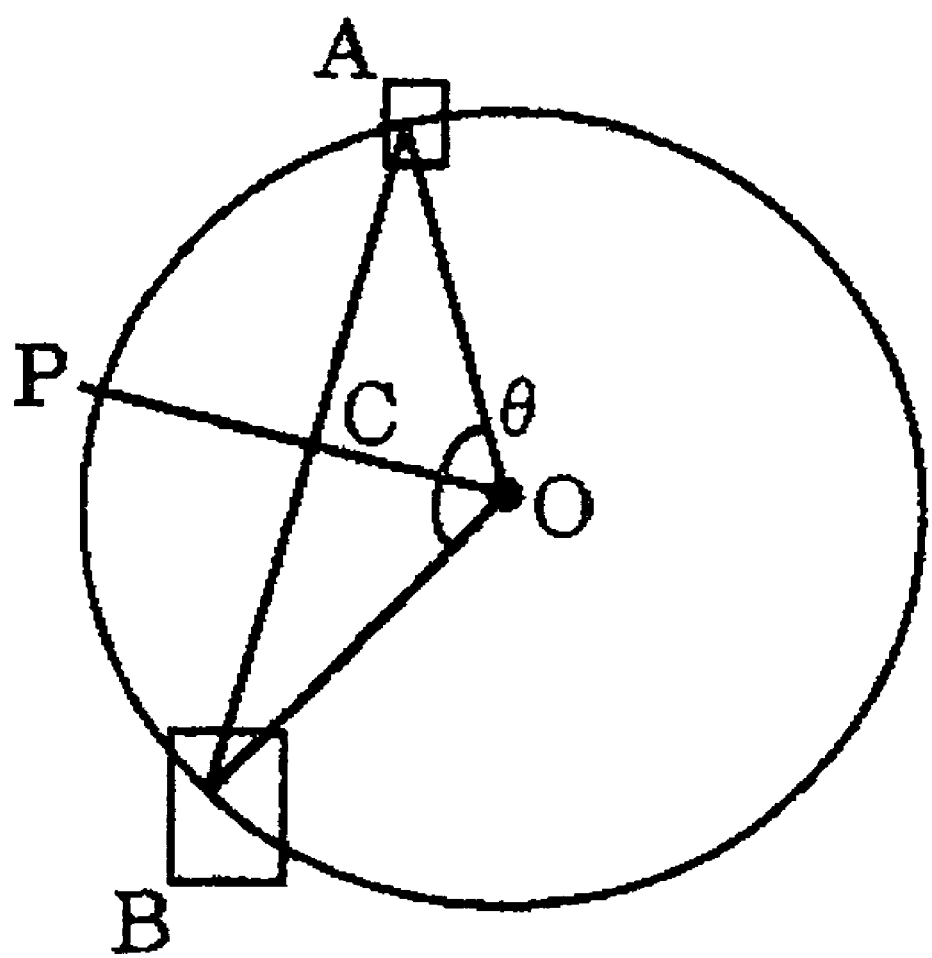
FIG. 19 is a model diagram for making a chord AB a variable with an arc AB constant.

According to FIG. 19, the following is a computational expression designed by a geometric circular arc. Here, A and B represent pads. A chord $AB=l_1$ represents a distance in a straight line between the most outer ends of the pads. Assuming that this is a variable and the circular arc AB between the adjacent pads is constant, a relational expression for finding a radius $OP=r_1$ is established. An angle ACO is a right angle, and an angle $AOB=\theta_1$. Now, when the segment $PC=r_1-h_1$, $CO=h_1$, $(l_1/2)^2=r_1^2-h_1^2$, so that $\theta_1/2=\tan^{-1}(l_1/2h_1)$, and the circular arc $AB=r_1\theta_1$ [radian]. When $h_1$ is found out accordingly from these expressions, $r_1$ can be found out. Assuming that the circular arc $AB=r_1\theta_1$ is constant, $h_x$ and $r_x$ for the next and following distances $l_x$ between the pads can be found out. The radius $r_x$ between $l_x$ and each pad is as follows.

$$\text{Circular Arc } AB \text{ (constant)} = 2r_x\tan^{-1}\left(l_x/2\sqrt{r_x^2-\left(\frac{l_x}{2}\right)^2}\right)$$

Obviously, the circular arc AB may be an ellipse or an optional high-order curve without a sharp curve.

Figure 20:
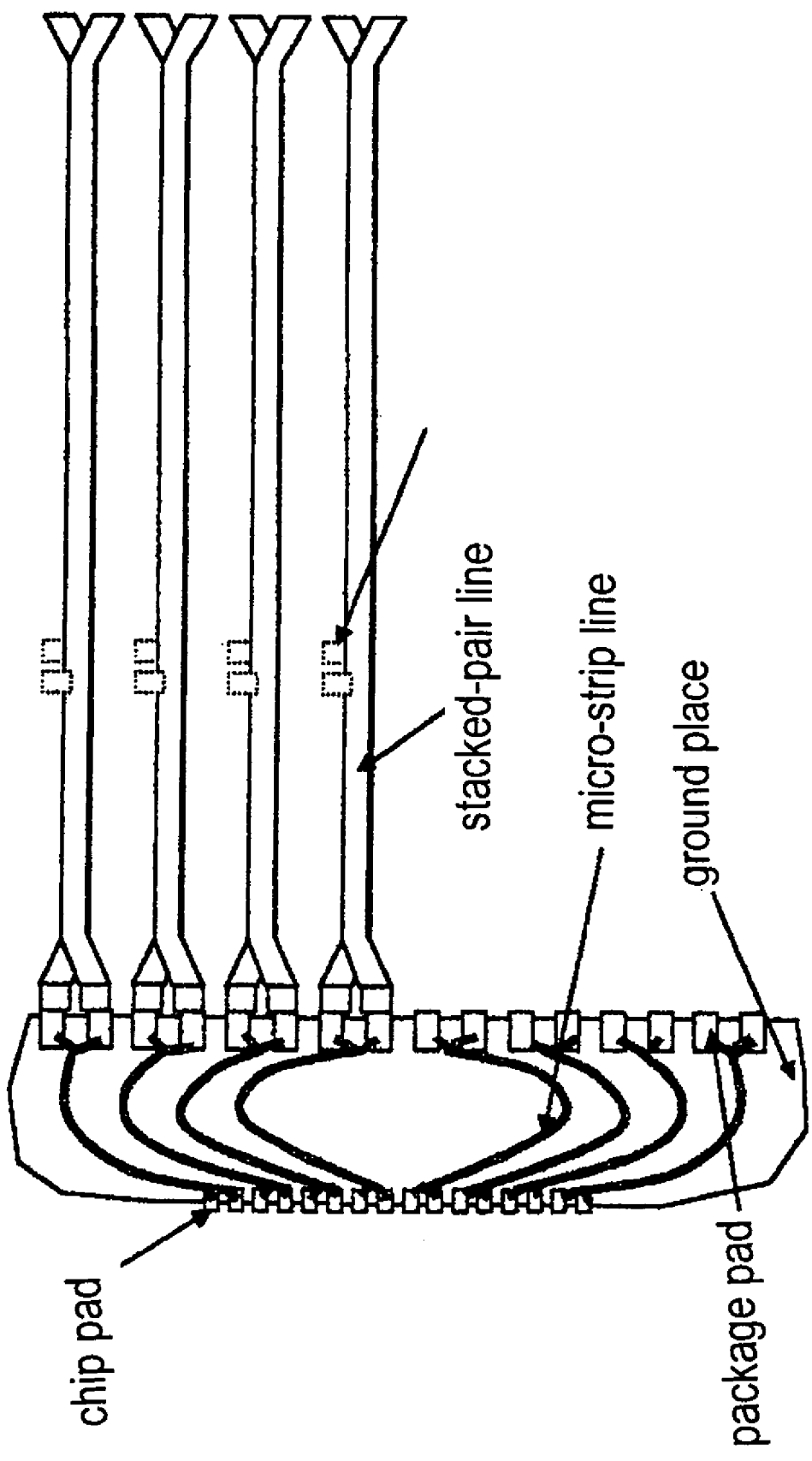
FIG. 20 is a diagram showing an example of a line structure for changing a line width with a constant distance between pair lines.

Now, although the proposal of the structure with the package has been presented, recently, a design method wherein the chip is directly connected on the printed-wiring board without the package and with a parallel-bus wiring through the fan-out wiring has been used commonly. It is difficult to change the distance d between the pair lines according to the line width w on the same basal plate. Even if it is possible, the cost will be high, and reliability of connection between the step parts will lower. The next proposal of a structure wherein the distance d between the pair lines is constant and the line width w is changed is presented in FIG. 20. It is proposed that the micro-strip line or strip line is used for the fan-out structure part, and the stacked-pair line is used for the parallel-bus line.

Since the micro-strip line or strip line has the electric field stretching to ground, a capacitance $C_o$ per unit length increases. As a result, $$Z_0 = \sqrt{\frac{L_0}{C_0}}$$

becomes smaller with the same line width w. Inversely, when $Z_o$ is constant, w can be small. The approximate expression of the micro-strip line (Harold A. Wheeler) (see the symbols in FIG. 15) is as follows.

$$Z_0 = \frac{377}{2.828\pi\sqrt{\varepsilon_r+1}}$$

-continued $$\ln\left[1+\frac{4d}{w}\left(\frac{14+\frac{8}{\varepsilon_r}}{11}\frac{4d}{w}+\sqrt{\left(\frac{14+\frac{8}{\varepsilon_r}}{11}\right)^2\left(\frac{4h}{w}\right)^2+\frac{1+\frac{1}{\varepsilon_r}}{2}\pi^2}\right)\right] \, [\Omega]$$

If $Z_o=28\,\Omega$, d=39 µm, and w=170 µm. In order to correct the effect of the thickness of the conductor (t=25 µm), the thickness t (25 µm) of the conductor may be subtracted empirically, so that the corrected line width w=145 µm can be obtained. When the stacked-pair line width w is 200 µm, the distance d between the same pair lines can be reduced to 39 µm. Also, when the micro-strip line is used, the line width w can be reduced to 145 µm.

The line width w=145 µm is not sufficient for a design wherein a space between the chip pads is the 50 µm pitch, and the line width w of the fan-out wiring is 100 µm. However, this problem can be solved by narrowing the nearest place of each pad. The wiring length for narrowing may be the same way as the diverging wiring length, and similar to the length of the impedance mismatch such as the column or veer hole, (6×total delay time for the narrowed-down length)<(start-up time) may be used.

Figure 21:
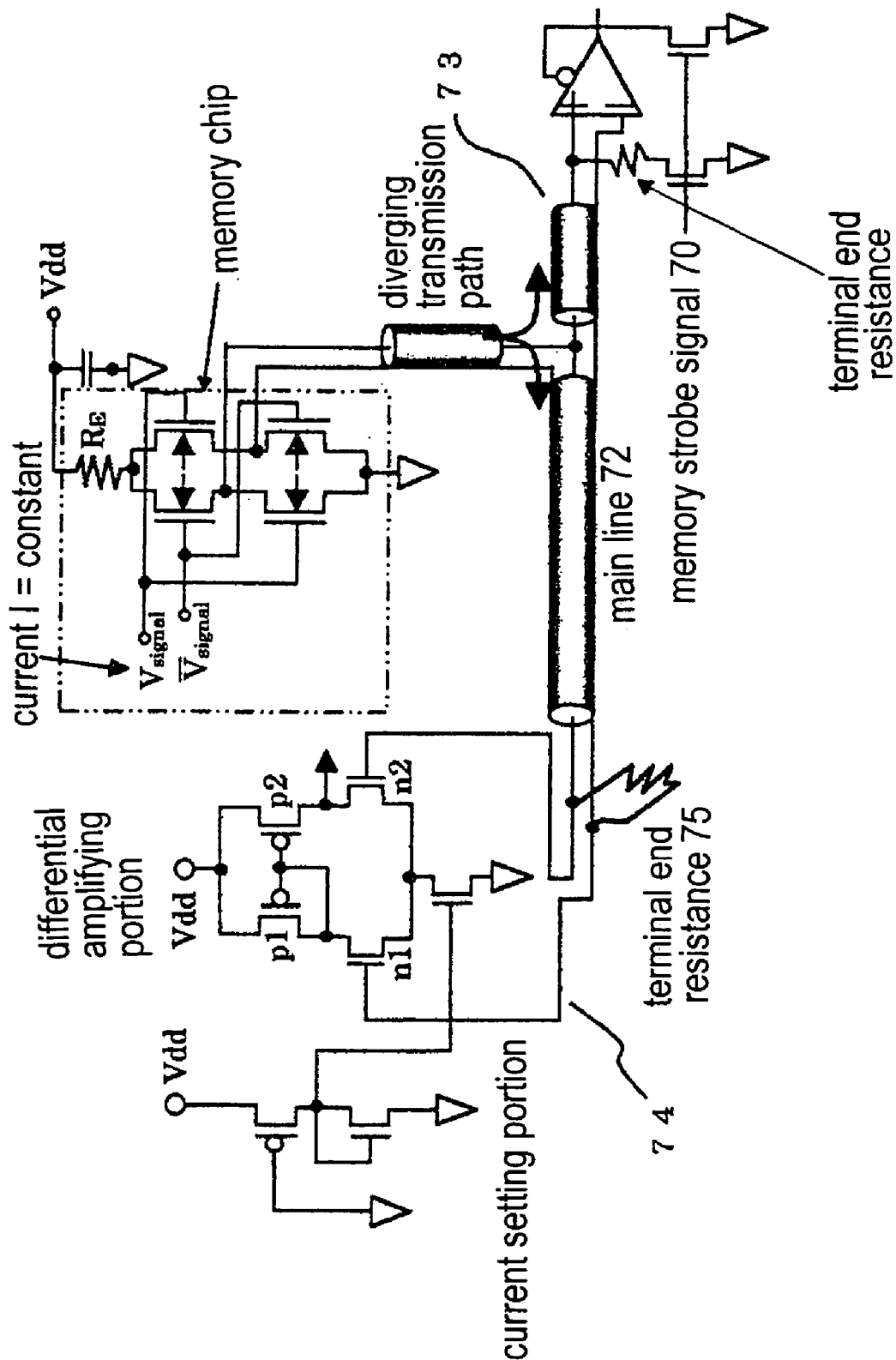
FIG. 21 is a diagram showing a sending circuit from a memory side.

A method when the memory chip sends out signals is shown in FIG. 21. The signals sent out by the driver of the memory run on both sides of the bus lines (72 and 73). Because of the same characteristic impedance, the signal voltage becomes ½ from the energy conservation law. The signal running to the right is a waste signal, so that it is essential that the receiver placed at the terminal end does not respond. Furthermore, when the receiver totally reflects and the waste signal returns to the left controller chip, the receiver responds in spite of the waste signal, so that this has to-be prevented as well. When the memory strobes and signals are sent out, the far right receiver receives the signals and becomes inactive. At the same time, the terminal end resistance (70) becomes active and the waste signals disappear at this point.

On the other hand, ½ regular signals reaching the controller chip (74) drive the receiver circuit of the controller (including the genetic-algorithm circuit), and are absorbed and dissolved at the eternal-end resistance (75) attached to the controller chip. However, since only half of the wave is modified and taken into the sense amp from all the reflected-signal modification already memorized, the correct waveform is recognized at the right timing.

Since both the driver and receiver are always high-impedance, when they are looked from the outside, there is no problem that sending-and-receiving circuits are placed side by side with one-bit bus.

Genetic-algorithm Circuit

An embodiment of the circuit adjusted by the genetic-algorithm circuit is shown.

The above-mentioned circuit does not allow independent L and C except $L_0$ and $C_0$ defining characteristic of the transmission circuit to exist as much as possible, and the frequency characteristic is eliminated. In other words, the expression of the characteristic impedance ZO is as follows.

$$Z_0 = \sqrt{\frac{j\omega L_0}{j\omega C_0}} = \sqrt{\frac{L_0}{C_0}}$$

An imaginary part (imaginary number part) and each frequency are eliminated. In other words, the transmission line is composed such that the impedance is a pure resistance component.

Figure 25:
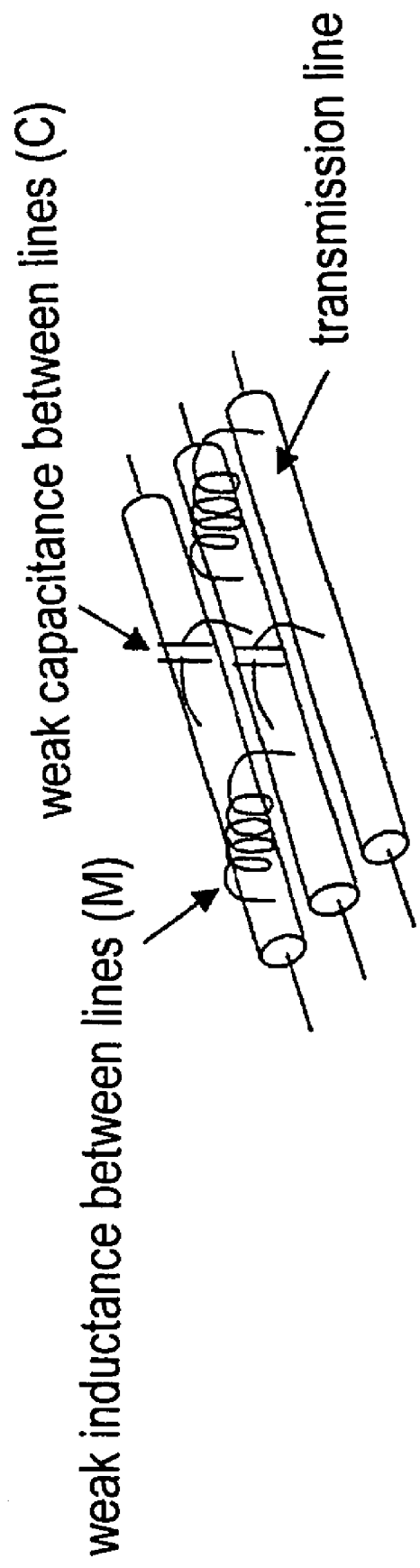
FIG. 25 is a schematic diagram showing a parasitic coupling element between lines.

However, even if it is designed completely, there are independent minute mutual inductance (M) and capacitance (C) which are parasitic due to a variation in a manufacturing condition. FIG. 25 shows the above-described condition. The transmission line shown in FIG. 10 is the transmission line wherein the electromagnetic field is almost closed, and in accordance with the above-described expression, the transmission line has a similar characteristic to a coaxial cable. FIG. 24 is shown based on the transmission lines. The concept is that a weak MC connection exists between the transmission lines. The MC connection can be possible at a chassis, veer hole, or connector besides between the lines. The problem caused by the weak MC connection can be ignored in a low frequency. However, in the pulse higher than 10 GHz, small parasitic M and C in the entire circuit have a large impact. The expression is shown by admittance Y as follows.

$$Y=(\omega C - 1/\omega M)$$

The admittance Y is not only significantly changed with an increase of ω, but also resonates on the condition of ωC−1/ωM=0. Accordingly, it is necessary to insert a circuit for eliminating the inevitable practical problem. The present invention proposes that a LC net is automatically produced with genetic algorithm for countervailing the parasitic M and C, and is overlapped with the driver signal. The structure is as follows.

(1) In order to ensure the high-speed signal, a reshaped waveform is a pure LCR net, and an electric-charge pump-up and pump-down type transistor determines which part thereof operates.

(2) A test signal is transmitted and whole reflected signal is received at the terminal end resistance. A voltage is detected and the waveform is analyzed. An analysis step is the LCR net, i.e. the complementary inverse transformation of waveform reshaping.

(3) The genetic-algorithm circuit for correcting the test signal is memorized until the system changes.

Figure 22:
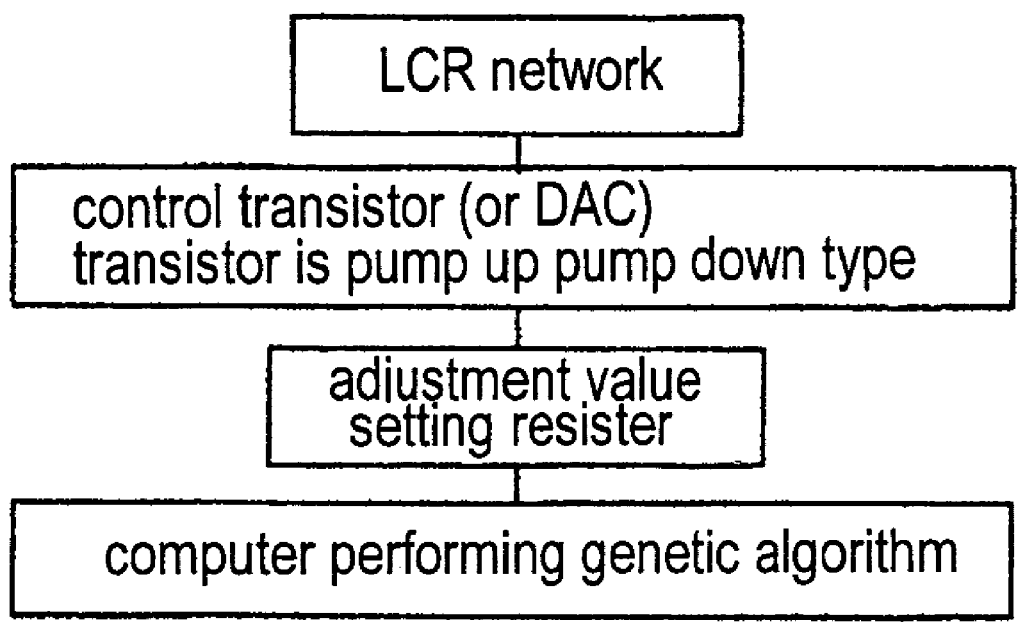
FIG. 22 is a diagram showing a signal adjustment circuit algorithm.

The algorithm is shown in FIG. 22.

Figure 23:
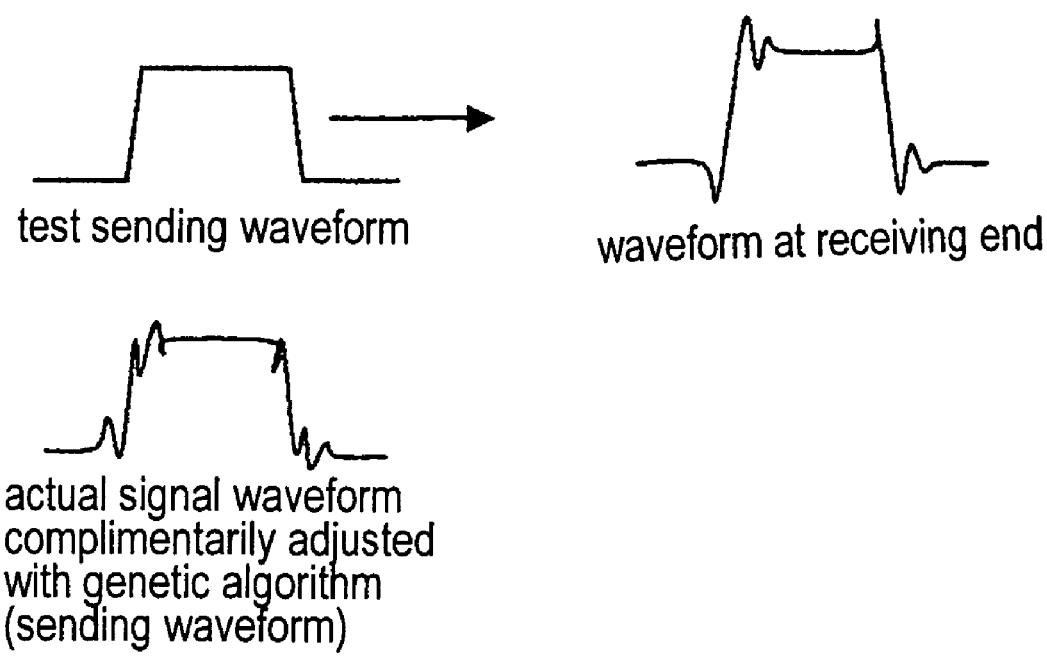
FIG. 23 is a chart showing an example of a process of processing a waveform for explaining algorithm.

It is structured such that a circuit connection in the LCR net-work can be freely changed at the control transistor. The receiving waveform is detected such that the original digital signal waveform can is received at the receiving end, and the sending waveform is adjusted to be a waveform complementary to the receiving waveform. The adjustment is performed by the genetic algorithm. Examples of the waveforms are shown in FIG. 23. The genetic algorithm is one of statistical search methods, and the genetic algorithm is: (1) effective in an extensive search; (2) no need for secondary information such as derivative value except evaluation function value; and (3) easy to install. Therefore, in the present invention, the genetic algorithm is preferably used for searching an adjustable parameter. The adjusting method may be other statistical search method including one or a combination of climbing-up method, annealing method, enumeration method, evolution policy, or taboo search method other than the genetic algorithm.

A basic circuit of the genetic algorithm and adjusting method are disclosed in Japanese Patent Application No. 11-240034 "Electronic Circuit and Adjusting Method thereof" (Japanese Patent Publication (Kokai) No. 2000-156627). As long as the circuit is fixed, the adjustment is required only once. An external computer may perform the genetic algorithm upon shipment of the system, and there is no need for the computer to be included in the system.

Figure 26:
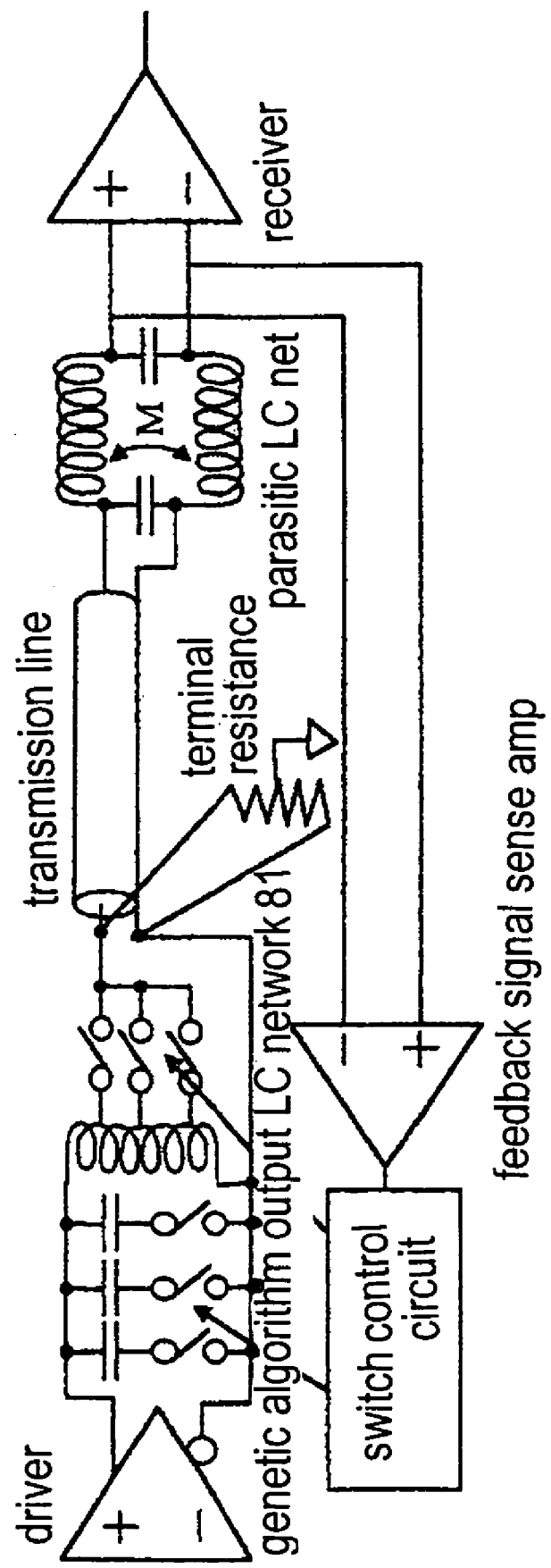
FIG. 26 is a diagram showing an example of a circuit model of genetic algorithm.

FIG. 26 shows an example of the LC circuit of the genetic algorithm. A genetic-algorithm output LC net 81 shown in FIG. 26 is schematic, and specific circuits thereof are shown in FIG. 34 to FIG. 38.

The adjusting method of the waveforms by the genetic algorithm is described with reference to FIG. 33 as follows.

Common Concept

The waveform on the sending side is adjusted (reshaping of the waveform) in order to obtain a desirable waveform on the receiving side, thereby improving quality of the signal transmission, i.e. so-called equalization.

A waveform-estimation circuit 91 is a circuit for estimating right and wrong of the waveform and outputting a voltage. Using a value of the result as a value of the evaluation function of the genetic algorithm, a state of reshaping the waveform is optimally controlled by the genetic algorithm (GA). To be more precise, in FIG. 33, the driver outputs a sending data to the transmission line with a differential pair, and includes a waveform-adjust function. The receiver receives a receiving data from a signal input through the transmission line. The waveform-estimation circuit 91 is the circuit including a function of quantitatively estimating a degree of a distortion of the signal waveform received at the receiver, and outputs the voltage value corresponding to the estimation result of the received waveform. An external device 92 performs the genetic algorithm or the statistical search method, and outputs the adjusted value of the waveform to the driver. The sending waveform of the driver output is adjusted by the control signal from the external device 92. Here, the voltage value output from the waveform-estimation circuit 91 is the value of the evaluation function in the genetic algorithm. The voltage value is inputted to the external device 92, and the genetic algorithm searches the adjusted value of the waveform so that the evaluated value of the receiving-signal waveform becomes the best. As a result, the waveform is optimized.

As the method of adjusting the waveform, there are two adjustments based on a frequency axis and a time axis as follows.

Adjustment by Frequency Axis (FIG. 34)

As an example of the adjustment by the frequency axis, a structure with an equalizing filter shown in FIG. 34 will be explained. The equalizing-filter circuit shown in FIG. 34 is mounted on the driver shown in FIG. 33. The equalizing-filter circuit compensates amplitude and phase on the frequency axis relative to a distortion of the signal waveform generated in the transmission line to minimize the distortion of the receiving waveform. The waveform is reshaped at the equalizing-filter circuit formed of at least two kinds of continuously connected circuits such as a circuit shown in FIG. 34(a) for mainly adjusting the amplitude and a circuit shown in FIG. 34(b) for adjusting the phase.

In this circuit, values of resistances R and values of capacitors C shown in the figure are adjusted such that the distortion of the receiving waveform is minimized by the genetic algorithm. It is difficult to meet a constant-resistance condition of the equalizing filter (optimal condition without a reflected signal) when only the resistances R and capacitors C are adjusted. In general, while it is extremely difficult to analyze characteristic in this condition, GA searches the sending waveform wherein the receiving waveform becomes the best (minimum distortion).

(Hereinafter, in the specification, "–" (over-line) is replaced with "_" (underline) for convenience of notation.)

Figure 35A:
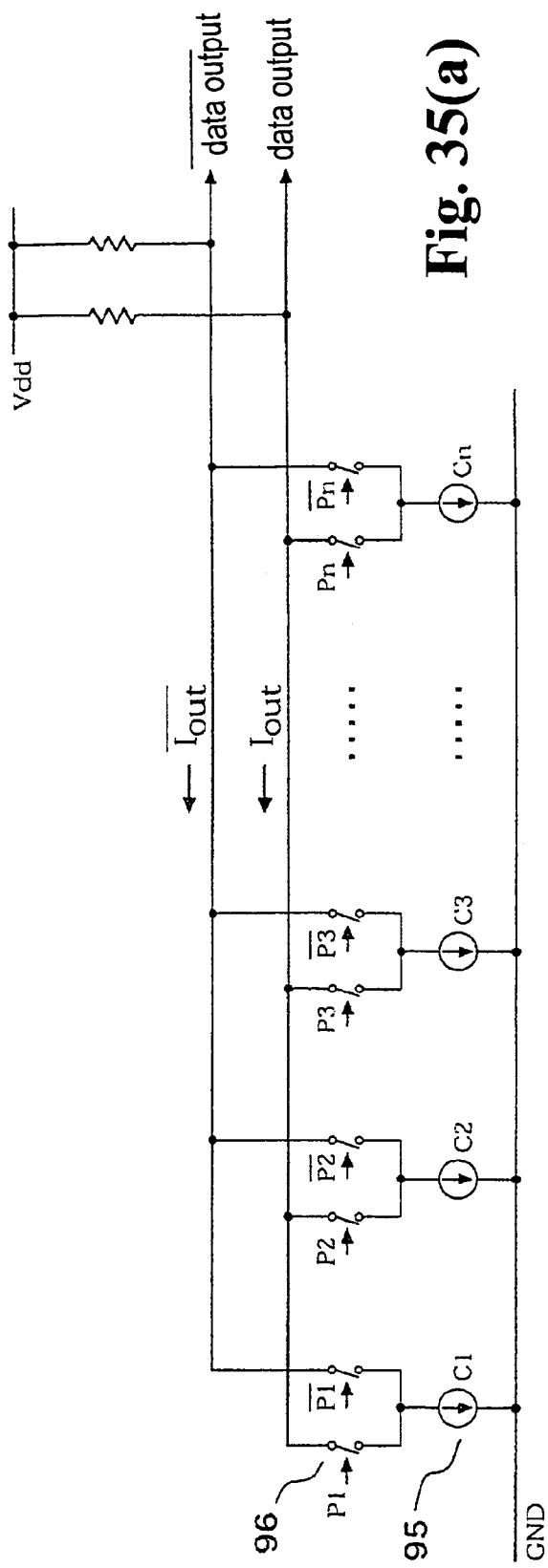
FIG. 35 is an explanatory diagram of principle of a circuit for adjusting a waveform on a time axis shown in FIG. 33.
Figure 35B:
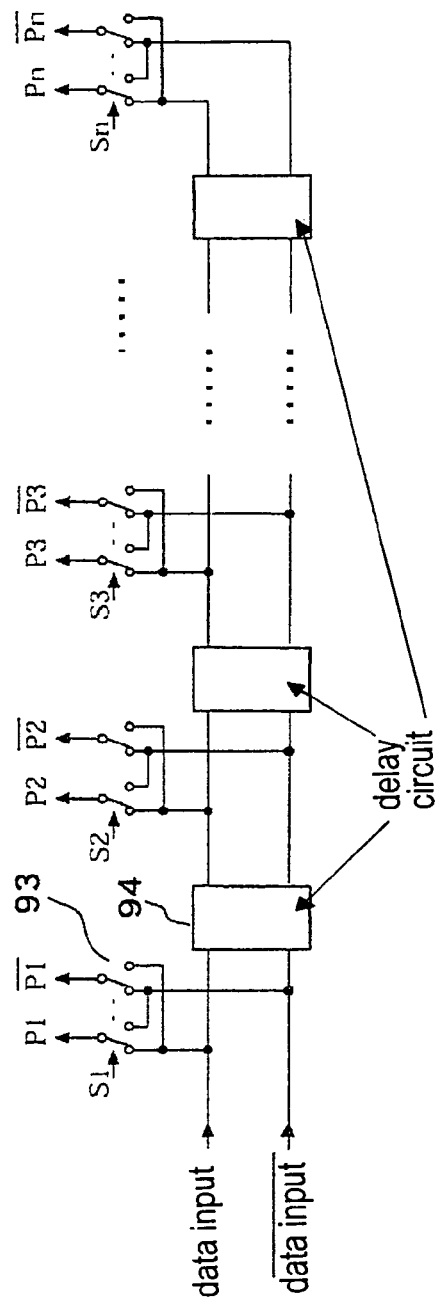
Figure 36:
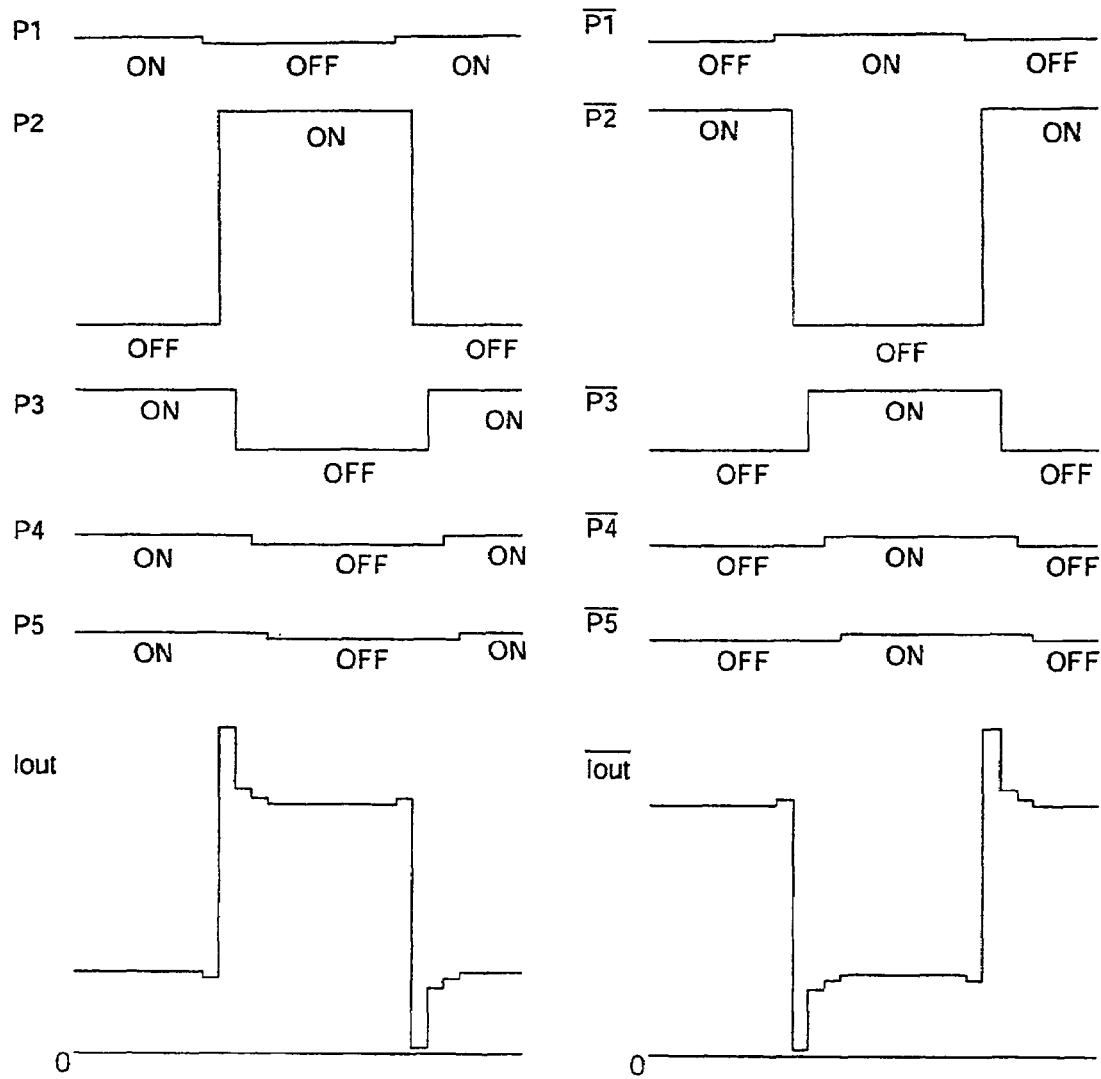
FIG. 36 is a chart showing a current waveform and an output current waveform of each switch when a waveform is adjusted on the time axis shown in FIG. 33.

Adjustment by Time Axis (FIG. 35 to FIG. 37)

An example of the adjustment by the time axis will be explained with FIG. 35 to FIG. 37. Circuits explained here are mounted on the driver shown in FIG. 33. First, FIG. 35 shows the principle of an operation of the circuits for adjusting the sending waveform on the time axis. The circuits are composed of: switching circuits 93 (switch arrays are S1~Sn, output signals according to the switch arrays are P1~Pn and P1~Pn, wherein Pn and Pn are complementary signals); delay circuits 94 for delaying a differential-input data by a predetermined timing; analog direct-current variable current sources 95 (each current value is C1~Cn); and high-speed switches 96 (after receiving the data-output signals P1~Pn and P1~Pn from the switching circuits 93, the switches turn on and off complementarily).

After receiving the digital signals of one set of the data input as the sending data (complementary signals are datainput), the signals of P1, P1 change via the switches S1 of the switching circuits 93 first, and the high-speed switches 96 corresponding to the P1, P1 operate. Accordingly, an output current of the variable current source 95 corresponding to the C1 (preset value of the current is the C1) is switched over, and one element of output currents Iout and Iout can be obtained.

In a similar fashion, the digital signals of one set of the data input pass through each delay circuit 94, a plurality of the predetermined delay timings is set, and a series of the signals P2~Pn and P2~Pn are produced. These signals are the complementary signals P2~Pn and P2~Pn for continuously operating the high-speed switches 96, and each current C2~Cn of each variable current source 95 turns on electricity.

Since the output side of each high-speed switch is all connected to each of a non-inverted signal and inverted signal in parallel, the combined complementary current Iout and Iout can be obtained. In each part of the high-speed switches 96, the current waveforms with a plurality of the predetermined timings from the input data are overlapped and reshaped.

The above-mentioned combined current Iout and Iout are outputted as the data output and dataoutput in the figure. These output signals are the output signals of the driver shown in FIG. 33. When a waveform is outputted for compensating a distortion of the waveform in the transmission line, the input waveform in the receiver has the minimum distortion.

A result of experiment conducted by the inventor shows a valid effect when, for example, a coaxial-pair wire used for a LAN or a long cable with a longer pair wire is used as the transmission line; and the circuits for adjusting the sending waveforms on the time axis have a two step structure. In other words, with the circuits formed of a pair of each of the switching circuits 93, switch arrays S1, S2, and direct-current variable current sources 95; and two pairs of the high-speed switches 96, the sending waveforms are adjusted on the time axis.

Only in this case, it is possible to adjust without using the statistical search method for searching an adjustable parameter of the sending waveform based on the receiving waveform. Therefore, the circuit structure becomes simple.

Figure 33:
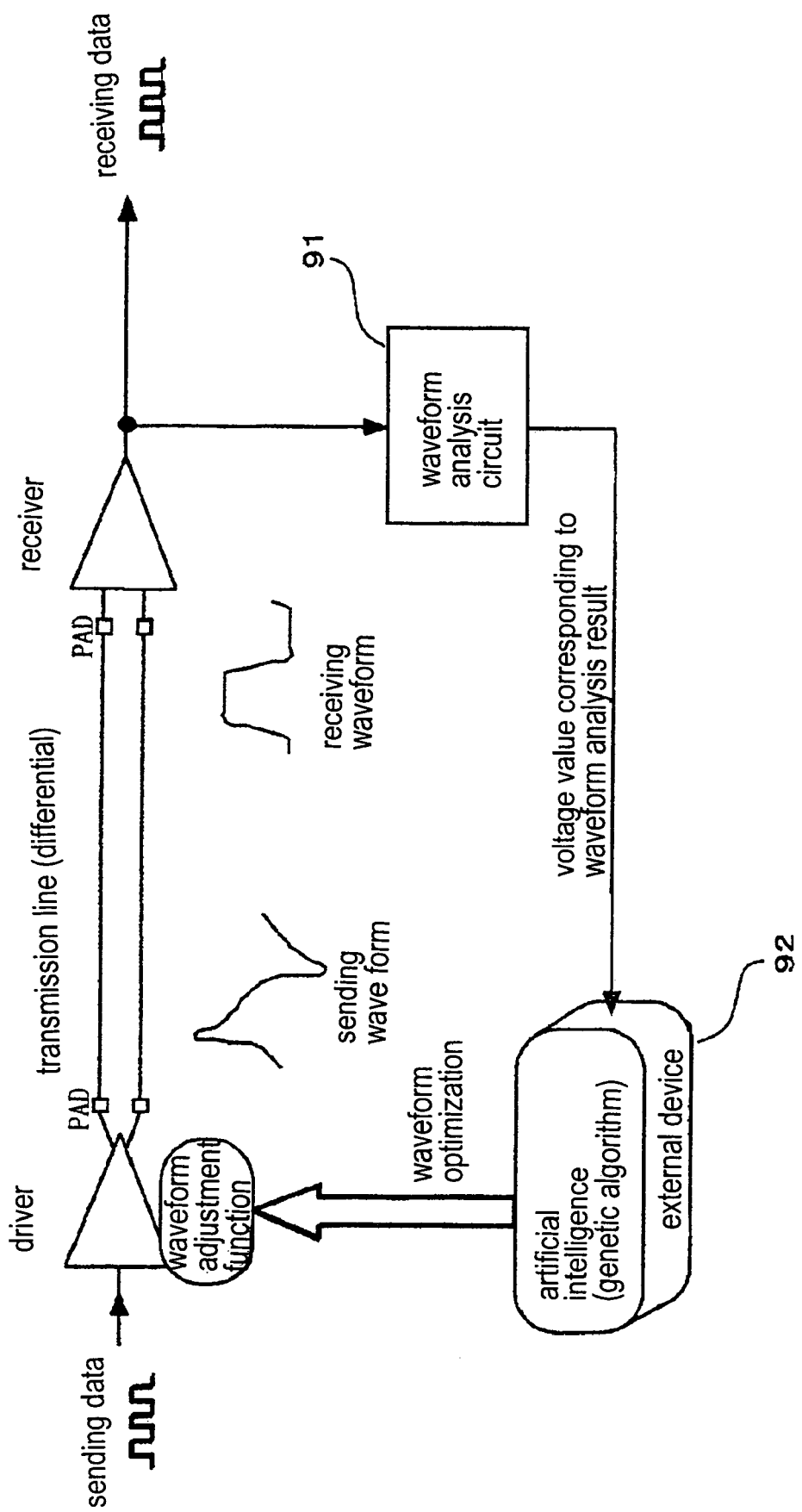
FIG. 33 is an explanatory diagram of adjustment method of a high-speed data transmission through equalization.

With the genetic algorithm performed in the external device 92 using the output voltage value of the waveform-estimation circuit 91 shown in FIG. 33, the setting of the current values C1~Cn of the variable current sources 95 and the switches S1~Sn of the switching circuits 93 are optimized. As a result, the sending waveforms are automatically adjusted such that the distortion of the receiving signals in the receiver becomes minimal.

FIG. 36 shows current waveforms flowing through each switch (pulse-height value corresponds to the C1~C5) when the high-speed switches 96 are composed of five sets (P1, P1, P2, P2, P3, P3, P4, P4, P5, P5). Composed currents flowing through each high-speed switch 96 (responding to P1, P1~P5, P5) are Iout and Iout. Since the currents flowing through each high-speed switch 96 are differential, the composed Iout and Iout are the differential currents as well. FIG. 37 shows mounted examples of principle structures shown in FIG. 35. Each operational element block is shown as the same numbers 93, 94, 95 and 96. Here, the transistor of the switching element is shown as FET, and may be a bipolar transistor.

Figure 42A:
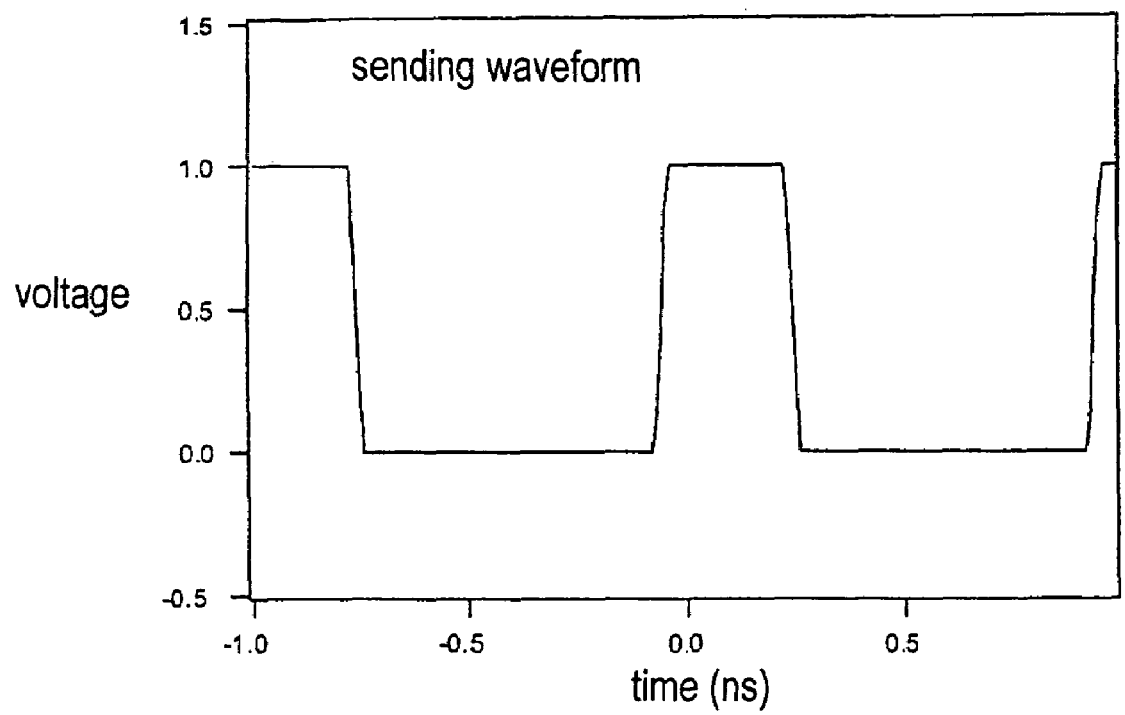
FIG. 42 is a chart showing a sending waveform and receiving waveform without waveform adjustment.
Figure 42B:
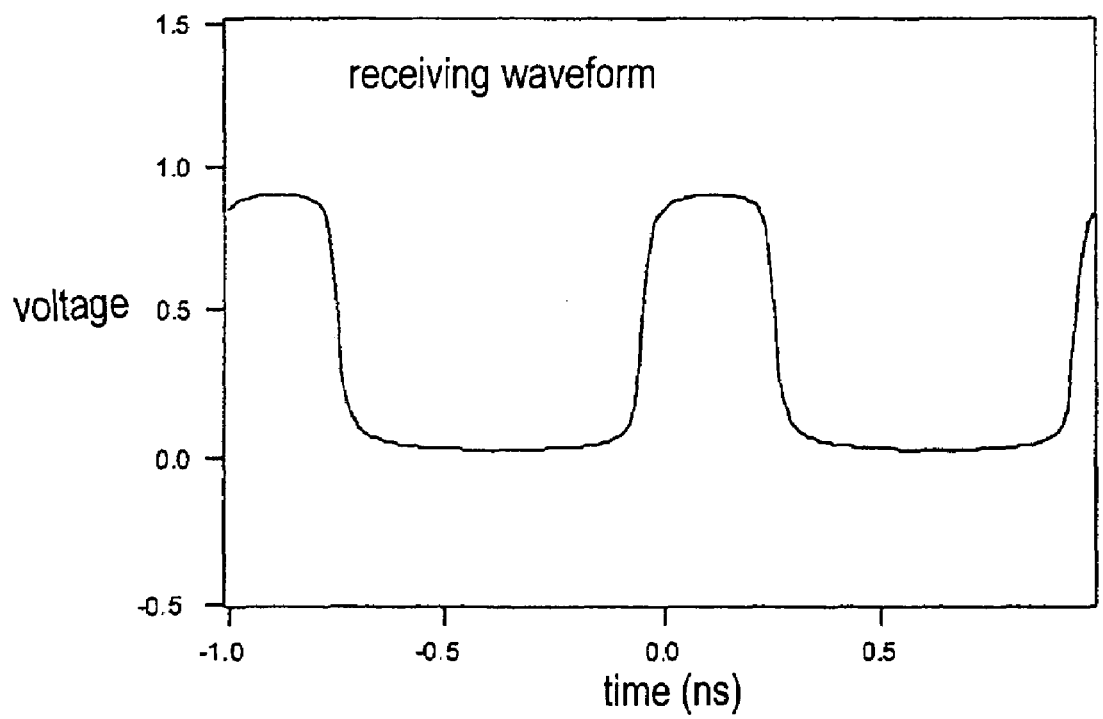
Figure 43A:
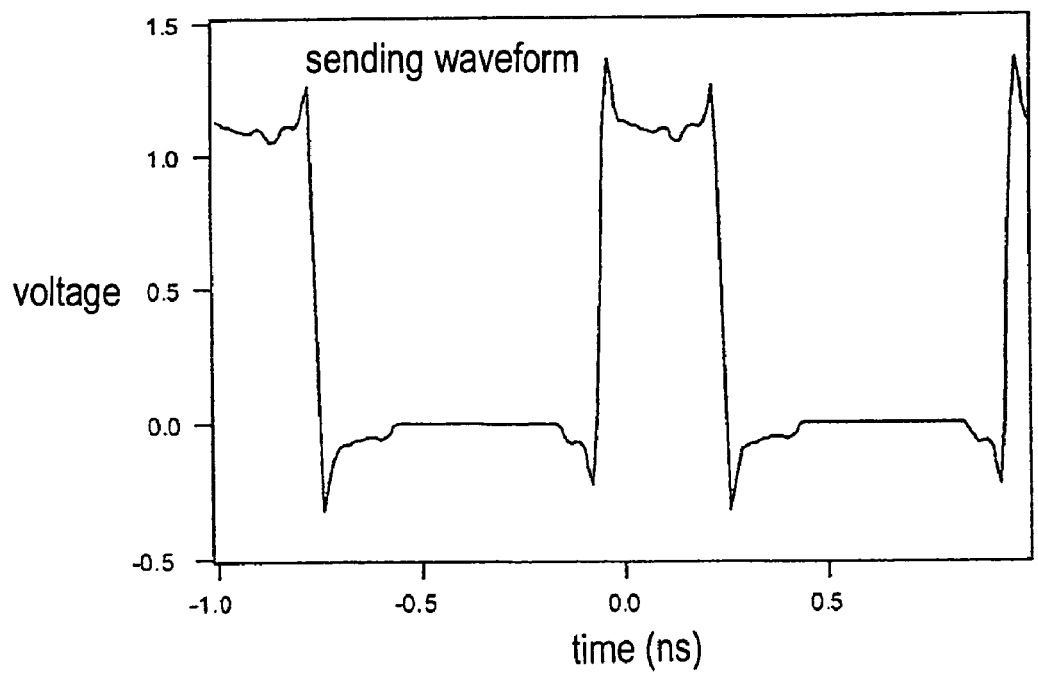
FIG. 43 is a chart showing the sending waveform and receiving waveform with waveform adjustment shown in FIG. 33.
Figure 43B:
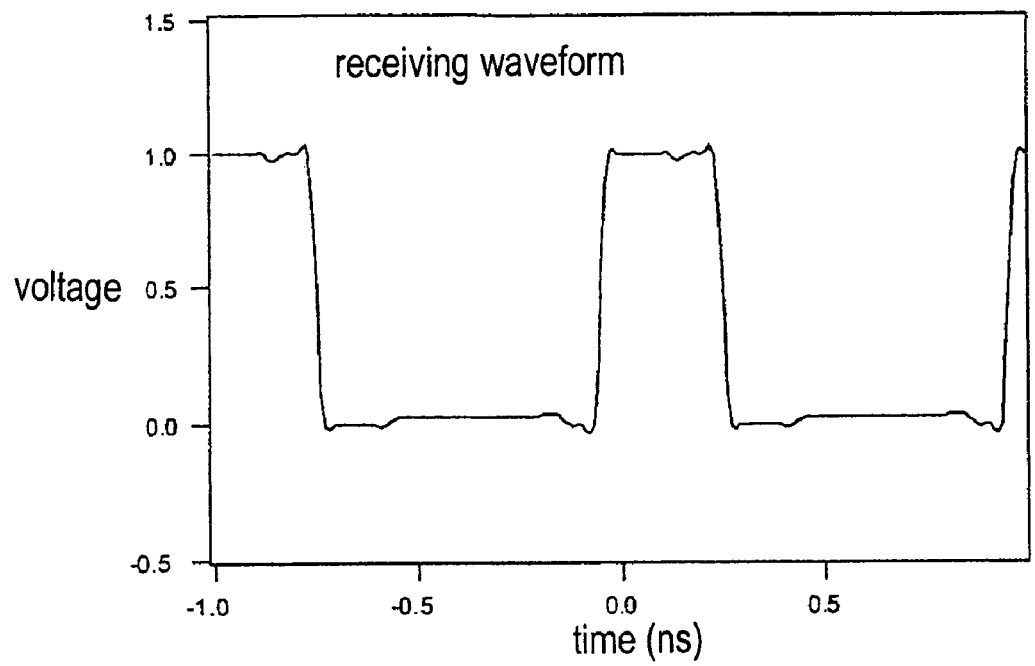

FIG. 42 and FIG. 43 show comparative examples in cases without the above-mentioned reshaping of the waveform and with the reshaping of the waveform on the time axis as stated above. In the case of FIG. 42 wherein the waveform is not reshaped, an ideal short-form wave 110 shown in FIG. 42(*a*) is received as the receiving waveform after passing through the transmission line and the sending waveform (output voltage of the driver) is simulated by a computer. As a result, a receiving waveform 111 shown in FIG. 42(*b*) is obtained. Since a high frequency component is attenuated in the transmission line, "1" and "0" of the digital signals become vague.

On the other hand, FIGS. 43(*a*) and 43(*b*) show a sending waveform 112 and receiving waveform 113 in the case that the waveform is reshaped on the time axis by the genetic algorithm. In this case, since the sending waveform 112 is adjusted so that "1" and "0" of the digital signals of the receiving waveform 113 passing through the transmission line have an almost ideal waveform, the receiving waveform 113 has voltage values corresponding to "1" and "0" of the digital signals. As a result, the almost ideal waveform with a small shift of the voltages can be obtained.

As another embodiment, a width of the upper and lower lines in the stacked-pair lines (FIG. 10) is changed as a new arrangement of the line structure, so that it is possible to minimize a change of the characteristic impedance of the lines relative to the displacement of the lines. At this time, it is possible to match the common-mode impedance by changing a thickness of the upper and lower insulating layers of the pair lines, and this modification can be added to the present invention.

INDUSTRIAL APPLICABILITY

As stated above, according to the high-speed signal transmission system of the present invention based on a variety of improvements, the I/O bus of the transmission clock corresponding to the LSI chip with the high-speed clock frequency higher than 2 GHz and same as the chip clock can be achieved.

This is a remarkable effect that the I/O bus, which conventionally could achieve only 533 MHz, can be dramatically made high speed.

The basis is the arrangement for skillfully matching with the high-speed pulse transmission bandwidth up to 20 GHz, and absorbing or canceling the floating capacitance or parasitic inductance.

These arrangements are novel, and also the use of the genetic algorithm has an important effect.

Accordingly, it is possible to ensure the bandwidth of the I/O matching with the LSI clock, and make the whole data-processing system including data transfer with memory faster corresponding to the high-speed LSI chip.

What is claimed is:

1. A high-speed signal transmission system comprising:
waveform analysis means for analyzing a defect relative to signal transmission of a line,
waveform reshaping means for reshaping a sending waveform, said waveform reshaping means including a line driver circuit of adding a current, and
regulator means for controlling the waveform reshaping means to obtain a waveform in a good condition at a receiving end based on an output from the waveform analysis means,
wherein said regulator means is adjusted by statistical search method, and said statistical search method includes one or a combination of genetic algorithm, climbing-up method, annealing method, enumeration method, evolution policy, and taboo search method.

2. A high-speed signal transmission system according to claim 1, wherein the waveform analysis means analyzes a whole reflected signal of a test signal transmitted.

3. A high-speed signal transmission system according to claim 2, wherein the waveform reshaping means reshapes the sending waveform based on a result from the waveform analysis means in order to obtain a desirable waveform the receiving end.

4. A high-speed signal transmission system comprising:
waveform analysis means for analyzing a defect relative to signal transmission of a line,
waveform reshaping means for reshaping a sending waveform, said waveform reshaping means including a line driver circuit of adding a current, and
regulator means for controlling the waveform reshaping means to obtain a waveform in a good condition at a receiving end based on an output from the waveform analysis means, said regulator means being adjusted based on a frequency axis and a time axis by genetic algorithm.

5. A high-speed signal transmission system comprising:
waveform analysis means for analyzing a defect relative to signal transmission of a line,
waveform reshaping means for reshaping a sending waveform, said waveform reshaping means including a line driver circuit of adding a current, and
regulator means for controlling the waveform reshaping means to obtain a waveform in a good condition at a receiving end based on an output from the waveform analysis means,
wherein said regulator means is adjusted by statistical search method,
said statistical search method includes one or a combination of genetic algorithm, climbing-up method, annealing method, enumeration method, evolution policy, and taboo search method, and
said line driver circuit includes a plurality of constant current circuits with a current mirror circuit, a delay circuit of sending data, and a switching circuit for connecting the plurality of the constant current circuits to the line based on the sending data or an output from the delay circuit.

6. A high-speed signal transmission system according to claim 5, wherein said line is matched with a characteristic impedance from a sending end to a terminal end, a sense amp on the receiving end receives a mixture of the sending waveform and a total-reflection waveform, and a terminal resistance is inserted in the sending end so that the total-reflection waveform is not transmitted from the sending end through re-reflection, said waveform analysis means being connected to the sending end.

7. A high-speed signal transmission system according to claim 5, wherein said line has a structure that a TEM mode is maintained.

8. A high-speed signal transmission system according to claim 7, wherein said line has a portion where an electromagnetic wave leaks into air, said portion being coated with a high permittivity material so that an effective permittivity of the portion matches a permittivity of an internal dielectric member.

9. A high-speed signal transmission system according to claim 7, wherein said line has one of structures of a pair coplanar, stacked-pair, guard stacked-pair, and guard coplanar.

10. A high-speed signal transmission system according to claim 5, wherein said line has a driver circuit and a receiver circuit formed of a MOS-FET of Si or SiGe, or an n-channel MES-FET of GaAs, and includes a differential output circuit and differential input circuit without ground connection, a schottky high-speed bipolar differential circuit, or a bus-switch circuit; varactors having a structure of one of a complementarily same MOS-FET, MES-FET, and a bipolar transistor are arranged in all transistors; and complementary operating elements have a common well floated electrically.

* * * * *